US009847113B2

(12) United States Patent
Choi et al.

(10) Patent No.: US 9,847,113 B2
(45) Date of Patent: Dec. 19, 2017

(54) DELAY-LOCKED LOOP CIRCUIT AND SEMICONDUCTOR MEMORY DEVICE INCLUDING THE SAME

(71) Applicant: Samsung Electronics Co., Ltd., Suwon-si (KR)

(72) Inventors: Hun-dae Choi, Seoul (KR); Young-kwon Jo, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/258,672

(22) Filed: Sep. 7, 2016

(65) Prior Publication Data

US 2017/0125077 A1    May 4, 2017

(30) Foreign Application Priority Data

Oct. 28, 2015  (KR) .................. 10-2015-0150271

(51) Int. Cl.
| | |
|---|---|
| *G11C 8/18* | (2006.01) |
| *G11C 7/00* | (2006.01) |
| *G11C 7/22* | (2006.01) |
| *G11C 11/4076* | (2006.01) |
| *H03L 7/081* | (2006.01) |
| *H03K 5/14* | (2014.01) |
| *H03K 5/00* | (2006.01) |
| *G11C 29/02* | (2006.01) |

(52) U.S. Cl.
CPC .............. *G11C 7/222* (2013.01); *H03K 5/14* (2013.01); *H03L 7/0812* (2013.01); *G11C 8/18* (2013.01); *G11C 11/4076* (2013.01); *G11C 29/023* (2013.01); *H03K 2005/00019* (2013.01)

(58) Field of Classification Search
CPC .. G11C 7/222; G11C 8/18; G11C 7/22; G11C 11/4076; G11C 29/023; H03K 5/14; H03K 2005/00019; H03L 7/08
USPC .................... 365/194, 233.1, 233.11, 233.12
See application file for complete search history.

(56) References Cited

U.S. PATENT DOCUMENTS

| | | | |
|---|---|---|---|
| 6,339,553 B1 * | 1/2002 | Kuge .................. | G11C 7/1066 327/291 |
| 6,801,472 B2 * | 10/2004 | Lee ........................ | H03K 5/133 365/189.07 |
| 7,499,370 B2 | 3/2009 | Kim et al. | |

(Continued)

FOREIGN PATENT DOCUMENTS

| | | |
|---|---|---|
| KR | 10-2014-0112663 | 9/2014 |
| KR | 10-2015-0063242 | 6/2015 |

*Primary Examiner* — Ly D Pham
(74) *Attorney, Agent, or Firm* — Muir Patent Law, PLLC

(57) ABSTRACT

Provided is a delay-locked loop circuit for providing a delay-locked clock signal to a data output buffer, the delay-locked loop circuit including: a first delay-locked-mode-based selector configured to select, as a first selected clock signal, one of a first divided clock signal, which is obtained by dividing a reference clock signal by N, and the reference clock signal; and a delay-locked mode controller configured to determine a delay-locked mode on the basis of a command received from the outside and to control the first delay-locked-mode-based selector according to the delay-locked mode. The delay-locked clock signal is generated by comparing a phase of a feedback clock signal generated from the first selected clock signal with a phase of the reference clock signal.

9 Claims, 22 Drawing Sheets

(56) References Cited

U.S. PATENT DOCUMENTS

| | | |
|---|---|---|
| 7,893,738 B2 | 2/2011 | Kang et al. |
| 8,305,839 B2 | 11/2012 | Tsern et al. |
| 8,742,806 B2 | 6/2014 | Yun et al. |
| 8,917,128 B1 | 12/2014 | Baek et al. |
| 9,007,861 B2 * | 4/2015 | Miyano ................ G11C 7/1066 327/156 |
| 9,035,684 B2 | 5/2015 | Jung et al. |
| 2005/0195663 A1 * | 9/2005 | Kwak .................... H03L 7/0814 365/194 |
| 2007/0069772 A1 * | 3/2007 | Choi ..................... G11C 7/1072 327/158 |
| 2007/0069779 A1 * | 3/2007 | Kim ....................... H03L 7/0805 327/158 |
| 2009/0002039 A1 * | 1/2009 | Yun ....................... H03L 7/0812 327/158 |
| 2009/0121784 A1 * | 5/2009 | Lee ......................... G11C 5/143 327/544 |
| 2010/0195423 A1 * | 8/2010 | Oh ........................ H03L 7/0812 365/194 |
| 2011/0062998 A1 * | 3/2011 | Mitsubori ............ G11C 7/1051 327/152 |
| 2014/0266351 A1 | 9/2014 | Na et al. |
| 2014/0293719 A1 | 10/2014 | Jung |
| 2015/0109034 A1 | 4/2015 | Vasudevan et al. |
| 2015/0187401 A1 | 7/2015 | Choi |
| 2015/0221285 A1 * | 8/2015 | Song .................... G09G 3/3208 345/210 |

\* cited by examiner

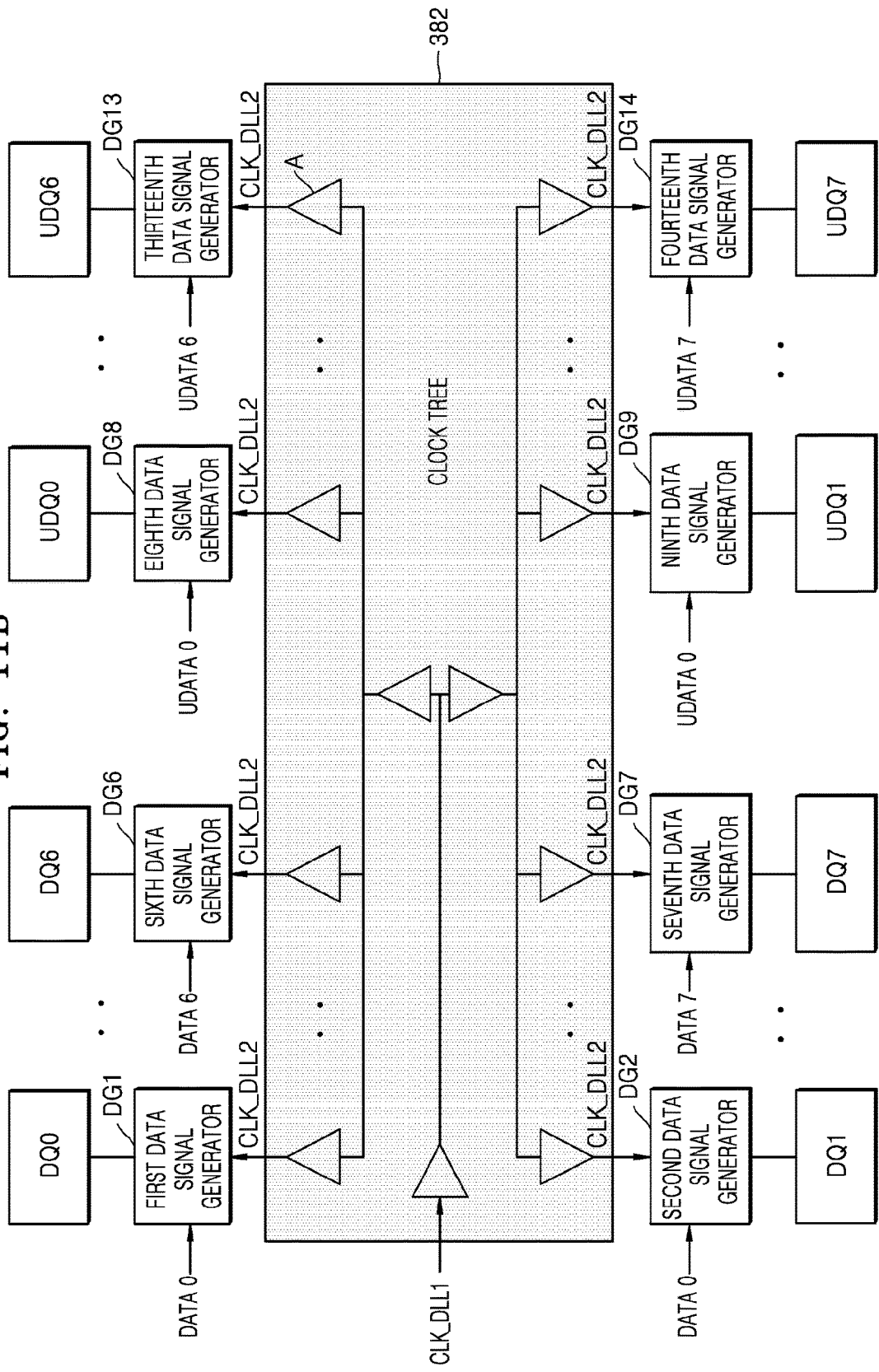

DELAY-LOCKED LOOP CIRCUIT AND SEMICONDUCTOR MEMORY DEVICE INCLUDING THE SAME

CROSS-REFERENCE TO RELATED APPLICATION

This application claims the benefit of Korean Patent Application No. 10-2015-0150271, filed on Oct. 28, 2015, in the Korean Intellectual Property Office, the disclosure of which is incorporated herein in its entirety by reference.

BACKGROUND

The exemplary implementations of the subject matter described herein relate to a delay-locked loop circuit and a semiconductor memory device including the same, and more particularly, to a delay-locked loop circuit capable of decreasing power consumption and a locking time and a semiconductor memory device including the same.

In systems or circuits, a clock signal has been used as a reference signal for synchronizing timings of operations and used to guarantee more rapid operations without causing errors. When an external clock signal supplied from the outside is used inside a system, clock skew may occur due to an inner circuit. A delay-locked loop circuit is used to compensate for the clock skew so that an internal clock signal of a semiconductor memory device may have the same phase as the external clock signal.

Recently, semiconductor memory devices have been developed to perform operations at higher speeds and thus high-frequency clock signals have been more frequently used. As high-frequency clock signals have been used, the amount of electric power to be used to generate an internal clock signal having the same phase as an external clock signal has increased and may thus prevent a low-power consuming semiconductor memory device from being realized.

SUMMARY

The exemplary implementations provide a delay-locked loop circuit capable of decreasing power consumption and a locking time, and a semiconductor memory device including the same.

According to an aspect of the exemplary implementations, there is provided a delay-locked loop circuit for providing a delay-locked clock signal to a data output buffer, the delay-locked loop circuit including: a first delay-locked-mode-based selector configured to select, as a first selected clock signal, one of a first divided clock signal, which is obtained by dividing a reference clock signal by N, and the reference clock signal; and a delay-locked mode controller configured to determine a delay-locked mode on the basis of a command received from the outside, and control the first delay-locked-mode-based selector according to the delay-locked mode. The delay-locked clock signal is generated by comparing a phase of a feedback clock signal generated from the first selected clock signal with a phase of the reference clock signal.

The delay-locked mode controller may control the first delay-locked-mode-based selector to select the first divided clock signal as the first selected clock signal when the delay-locked mode is determined to be a first delay-locked mode, and control the first delay-locked-mode-based selector to select the reference clock signal as the first selected clock signal when the delay-locked mode is determined to be a second delay-locked mode.

The delay-locked loop circuit may further include a second delay-locked-mode-based selector; and a delay line through which the first selected clock signal passes. The second delay-locked-mode-based selector may select one of a first delayed clock signal and a second divided clock signal as a second selected clock signal, wherein the first delayed clock signal is obtained by delaying the selected clock signal by the delay line and the second divided clock signal is obtained by dividing the first delayed clock signal by M.

The delay-locked mode controller may control the second delay-locked-mode-based selector to select the first delayed clock signal as the second selected clock signal when the delay-locked mode is determined to be the first delay-locked mode, and control the second delay-locked-mode-based selector to select the second divided clock signal as the second selected clock signal when the delay-locked mode is determined to be the second delay-locked mode.

The delay-locked loop circuit may further include a replica unit. The feedback clock signal may be a signal obtained when the second selected clock signal is delayed while passing through the replica unit.

The delay-locked mode controller may determine the delay-locked mode to be the first delay-locked mode when the command is not a command instructing the data output buffer to perform a data output operation.

When the command is a command instructing the data output buffer to perform a data output operation, the delay-locked mode may be determined to be the second delay-locked mode.

According to an aspect of the exemplary implementations, there is provided a semiconductor memory device including: a data output buffer including a plurality of data signal generators for generating data in synchronization with a delay-locked clock signal, and a clock tree; and a delay-locked loop circuit configured to select, as a selected clock signal, one of a divided clock signal, which is obtained by dividing a reference clock signal, and the reference clock signal on the basis of a received command, and to generate the delay-locked clock signal by using the selected clock signal and a delay-locked loop path including a path passing through the clock tree.

The delay-locked loop circuit may include a delay-locked mode controller configured to determine a delay-locked mode on the basis of the command, and controls one of the divided clock signal and the reference clock signal to be selected as the selected clock signal and controls active or inactive states of the plurality of data signal generators according to the determined delay-locked mode.

The delay-locked loop circuit may include a partial replica unit configured to generate a feedback clock signal by delaying a delayed clock signal passing through the clock tree, wherein a phase of the feedback clock signal is compared with a phase of the reference clock signal. The partial replica unit may have delay characteristics which are the same as delay characteristics of the data signal generator.

BRIEF DESCRIPTION OF THE DRAWINGS

Exemplary implementations of the inventive concept will be more clearly understood from the following detailed description taken in conjunction with the accompanying drawings in which:

FIG. 11B is a detailed block diagram of the data output buffer of FIG. 11A;

DETAILED DESCRIPTION

Figure 1:
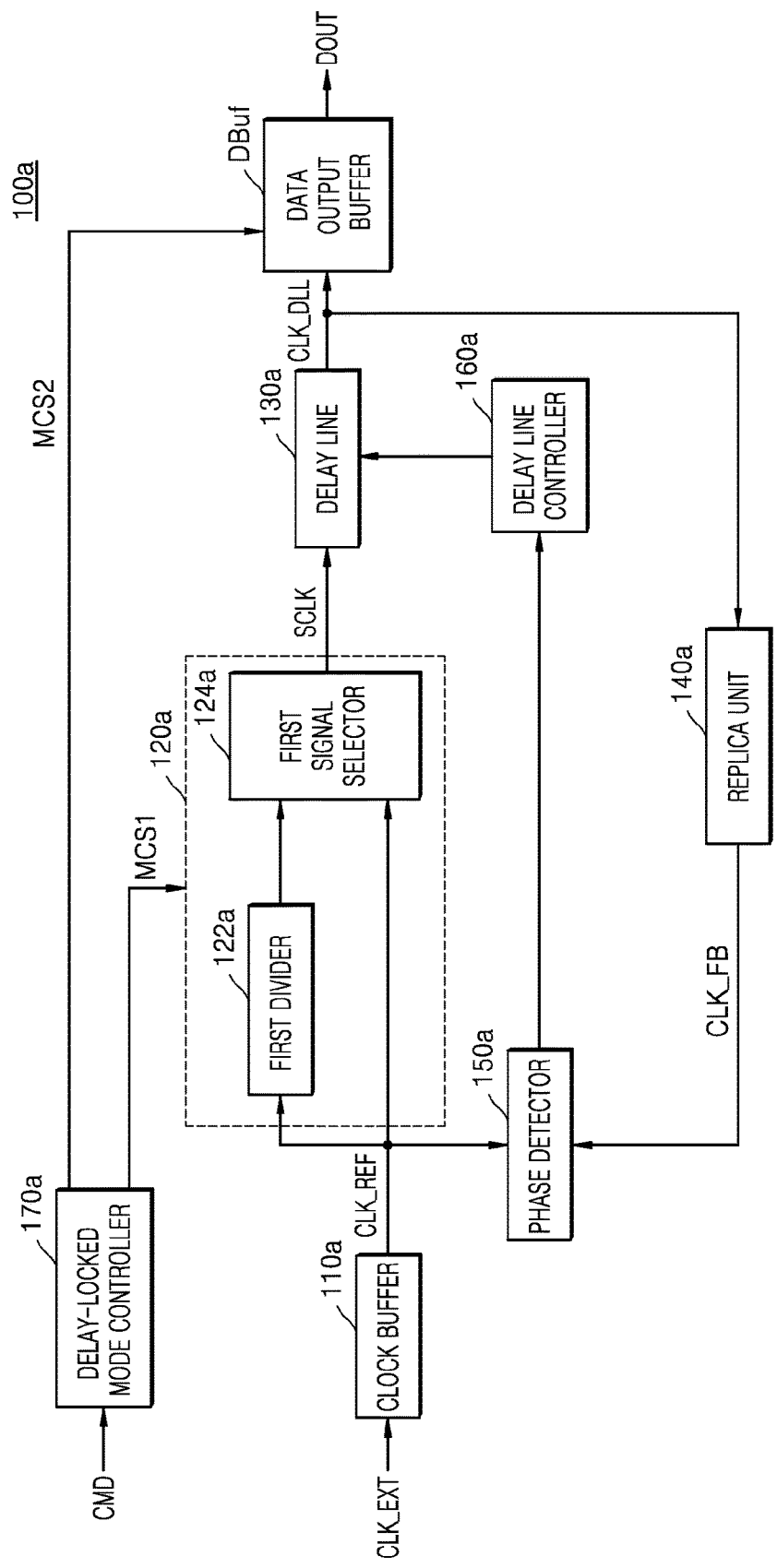
FIG. 1 is a block diagram of a delay-locked loop circuit according to an exemplary implementation.

Hereinafter, exemplary implementations of the subject matter described herein will be described in detail with reference to the accompanying drawings.

The exemplary implementations set forth herein may be embodied in many different forms and the inventive concept should not be construed as being limited to these embodiments.

The terminology used herein is for the purpose of describing particular exemplary implementations only and is not intended to be limiting of the inventive concept. As used herein, the singular forms 'a', 'an' and 'the' are intended to include the plural forms as well, unless the context clearly indicates otherwise. It will be further understood that the terms 'comprise' and/or 'comprising,' when used in this specification, specify the presence of stated features, integers, steps, operations, elements, and/or components, but do not preclude the presence or addition of one or more other features, integers, steps, operations, elements, components, and/or groups thereof. As used herein, the term 'and/or' includes any and all combinations of one or more of the associated listed items. Expressions such as 'at least one of,' when preceding a list of elements, modify the entire list of elements and do not modify the individual elements of the list.

It will be understood that, although the terms 'first', 'second', 'third', etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed in one section of the specification could be termed a second element, component, region, layer or section in another section of the specification or in the claims without departing from the teachings of the inventive concept. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Exemplary implementations of the inventive concept are described herein with reference to schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

FIG. 1 is a block diagram of a delay-locked loop circuit 100a according to an exemplary implementation. As illustrated in FIG. 1, the delay-locked loop circuit 100a may include a clock buffer 110a, a first delay-locked-mode-based selector 120a, a delay line 130a, a replica unit 140a, a phase detector 150a, a delay line controller 160a, and a delay-locked mode controller 170a. The clock buffer 110a may buffer an external clock signal CLK_EXT and output a reference clock signal CLK_REF.

The first delay-locked-mode-based selector 120a may include a first divider 122a and a first signal selector 124a. The first divider 122a may generate a first divided clock signal by dividing a reference clock signal CLK_REF. For example, the first divider 122a may divide the reference clock signal CLK_REF by N. Here, 'N' denotes an integer which is greater than or equal to '2'. The first signal selector 124a may select, as a selected clock signal SCLK, the first divided clock signal or the reference clock signal CLK_REF, and provide the selected clock signal SCLK to the delay line 130a. The delay line 130a may receive a delay control signal from the delay line controller 160a, and generate a delayed clock signal CLK_DLL by delaying the selected clock signal SCLK by the amount of delay according to the delay control signal.

The replica unit 140a may be a replica circuit that has delay characteristics copied from those of a data output buffer DBuf. For example, the amount of delaying a signal by passing the signal through the data output buffer DBuf may be the same as or substantially the same as the amount of delaying the signal by passing the signal through the replica unit 140a. The replica unit 140a may generate a feedback clock signal CLK_FB by delaying the delayed clock signal CLK_DLL by the amount of delay according to the copied delay characteristics.

The phase detector 150a may generate a phase comparison signal by comparing the phase of the feedback clock signal CLK_FB with the phase of the reference clock signal CLK_REF. For example, the phase detector 150a may enable the phase comparison signal when the phase of the feedback clock signal CLK_FB leads that of the reference clock signal CLK_REF and disable the phase comparison signal when the phase of the feedback clock signal CLK_FB lags behind that of the reference clock signal CLK_REF.

The delay line controller 160a may generate the delay control signal according to the phase comparison signal. For example, the delay line controller 160a may generate the delay control signal for increasing the amount of delaying the delay line 130a when the phase comparison signal is enabled, and generate the delay control signal for decreasing the amount of delaying the delay line 130a when the phase comparison signal is disabled.

The delay-locked mode controller 170a may determine a delay-locked mode on the basis of a command CMD received from the outside. For example, the delay-locked mode controller 170a may determine the delay-locked mode to be a first delay-locked mode or a second delay-locked mode according to the received command CMD. The delay-locked mode controller 170a may provide the first delay-locked-mode-based selector 120a with a first control signal MCS1 based on the determined delay-locked mode to control the first delay-locked-mode-based selector 120a to select the first divided clock signal or the reference clock signal CLK_REF as a selected clock signal SLCK. Also, the delay-locked mode controller 170a may provide the data output buffer DBuf with a second control signal MCS2 based on the determined delay-locked mode to control an active or inactive state of the data output buffer DBuf, as will be described in detail below.

The delay-locked loop circuit 100a according to an exemplary implementation is configured to provide the data output buffer DBuf with a delay-locked clock signal corresponding to the delayed clock signal CLK_DLL when the phase of the reference clock signal CLK_REF is the same as or substantially the same as that of the feedback clock signal CLK_FB. In this case, a path in which the reference clock signal CLK_REF passes through the delay-locked-mode-based selector 120a, the delay line 130a, and the replica unit 140a may be referred to as a first delay-locked loop path. A semiconductor memory device may be configured to include the delay-locked loop circuit 100a and the data output buffer DBuf.

Hereinafter, the delayed clock signal CLK_DLL may be referred to as a delay-locked clock signal when the phase of the reference clock signal CLK_REF is the same as or substantially the same as that of the feedback clock signal CLK_FB.

Figure 2:
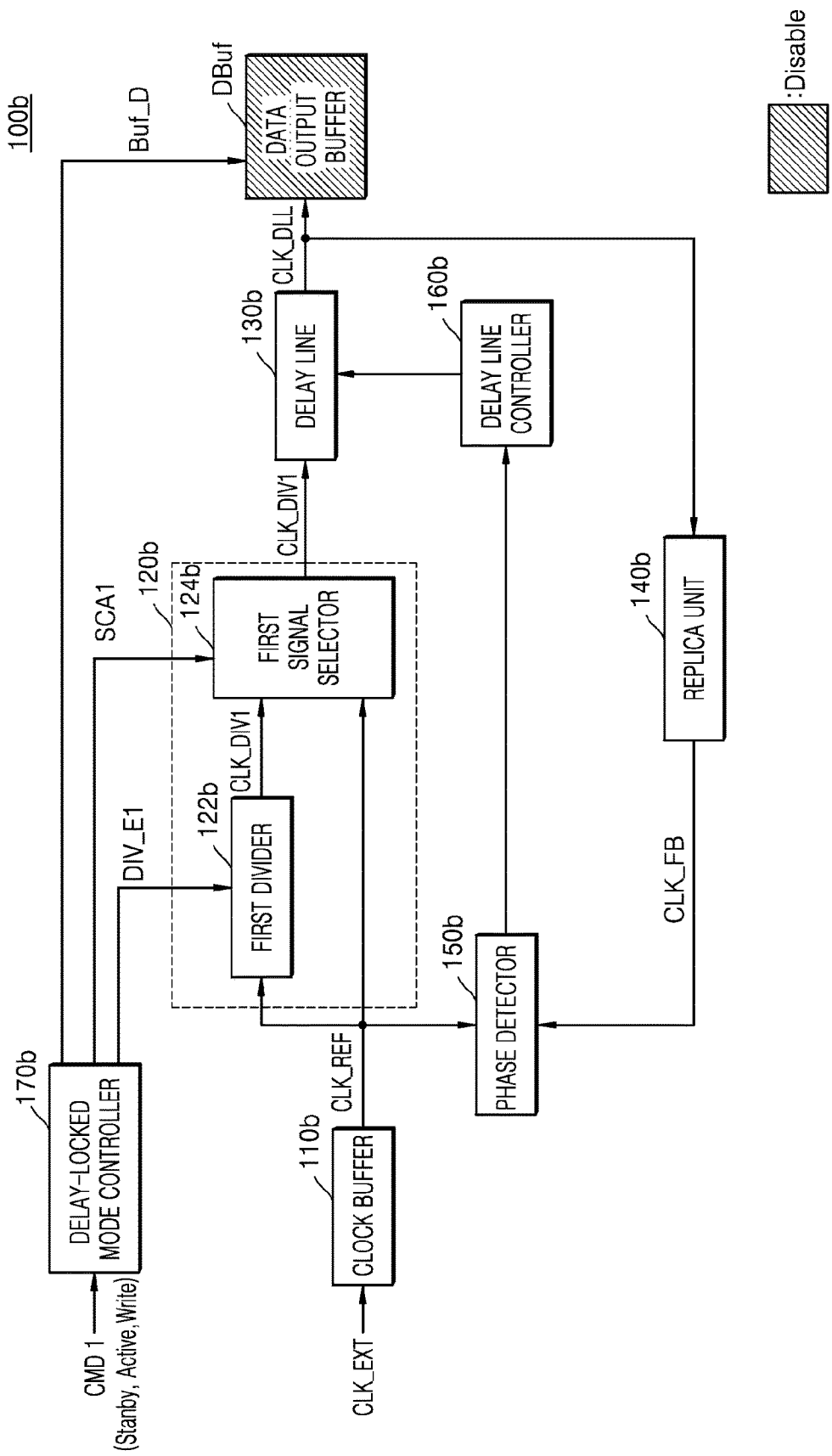
FIGS. 2 and 3 are block diagrams illustrating delay-locked loop operations of delay-locked loop circuits according to exemplary implementations.
Figure 3:
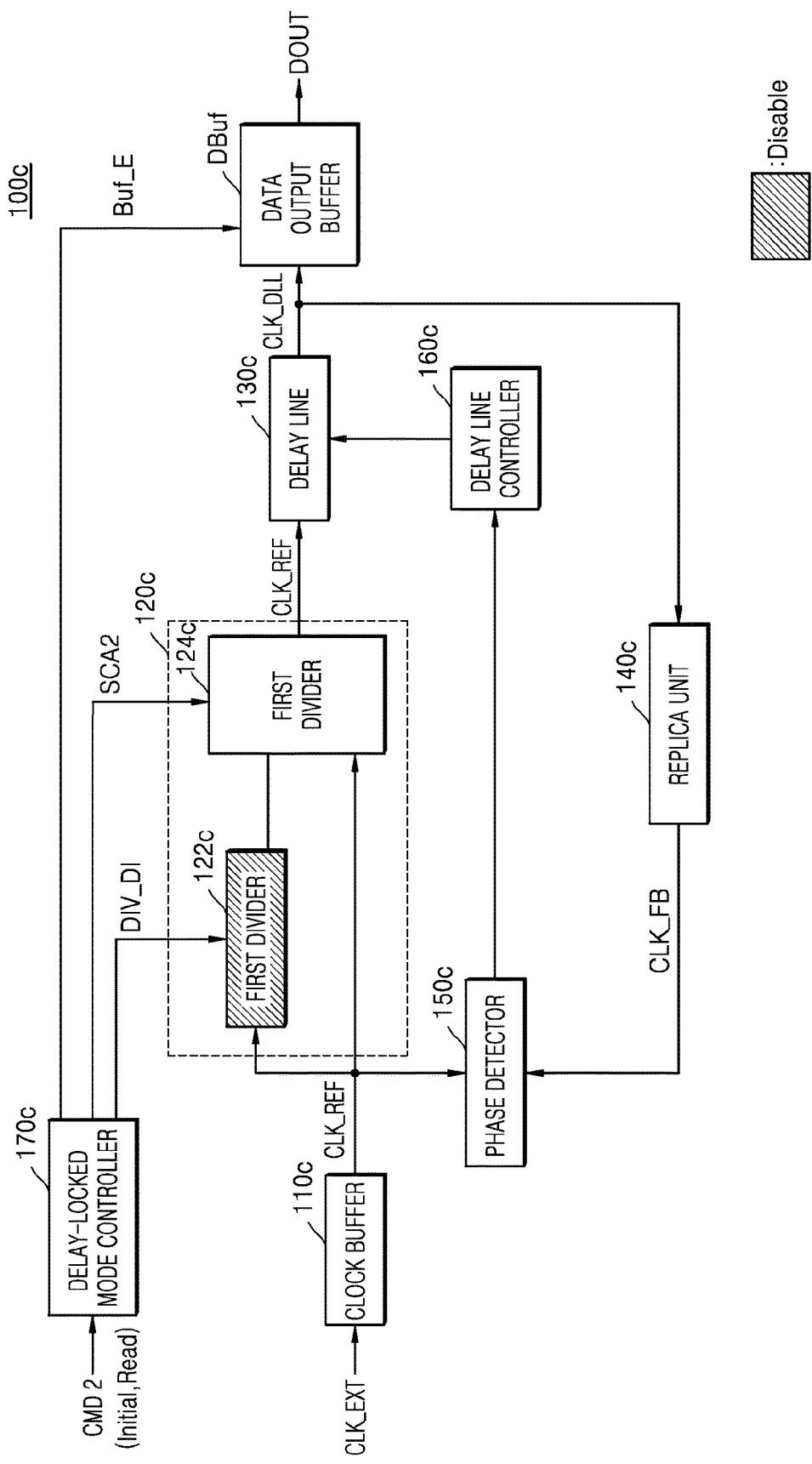
Figure 4A:
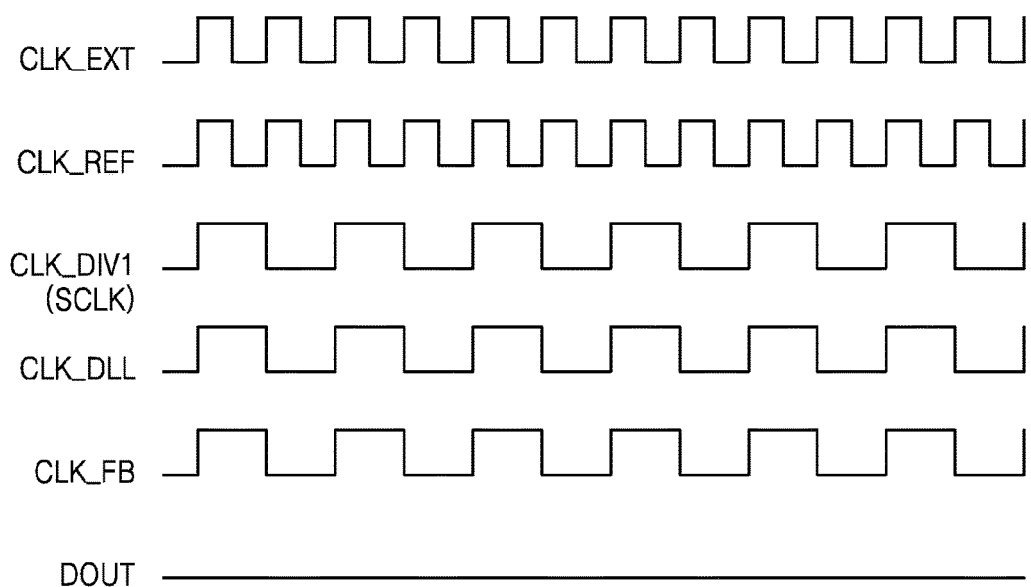
FIGS. 4A and 4B are timing diagrams illustrating delay-locked loop operations of delay-locked loop circuits according to exemplary implementations.
Figure 4B:
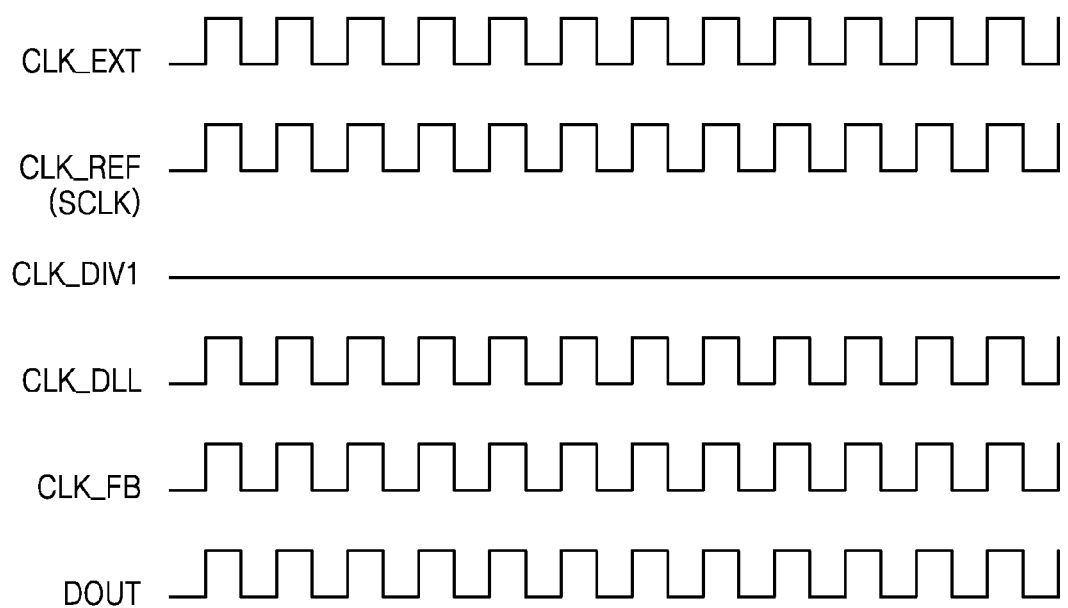

FIGS. 2 and 3 are block diagrams illustrating delay-locked loop operations of delay-locked loop circuits according to exemplary implementations. FIGS. 4A and 4B are timing diagrams illustrating delay-locked loop operations of a delay-locked loop circuit according to exemplary implementations.

As illustrated in FIG. 2, a delay-locked loop circuit 100b may correspond to the delay-locked loop circuit 100a of FIG. 1. An operation of the delay-locked loop circuit 100b will be described in detail below. First, a delay-locked mode controller 170b may determine a delay-locked mode to be the first delay-locked mode when receiving, from a data output buffer DBuf, a command CMD1 representing that a data output operation need not be performed. In one exemplary implementation, the command CMD1 may be a standby command, an active command, or a write command. The standby command may be received from a controller (not shown) which controls a semiconductor memory device including the delay-locked loop circuit 100b when no command is received from a host (not shown) for a predetermined time. The active command may be received from the controller to perform an active operation of the semiconductor memory device. The write command may be received from the controller to perform a data write operation on the semiconductor memory device.

In the first delay-locked mode, the delay-locked mode controller 170b may provide a first divider enable signal DIV_E1 to a first divider 122b to activate the first divider 122b. Thus the first divider 122b may generate a first divided clock signal CLK_DIV1 by dividing a reference clock signal CLK_REF by 2. The delay-locked mode controller 170b may provide a first divided clock signal selection signal SCA1 to a first signal selector 120b to select the first divided clock signal CLK_DIV1 as a selected clock signal. In one exemplary implementation, the first signal selector 120b may include at least one multiplexer (MUX) (not shown). Furthermore, the delay-locked mode controller 170b may provide a buffer disable signal Buf_D to the data output buffer DBuf to deactivate the data output buffer DBuf.

As described above, the delay-locked mode controller 170b may control the first delay-locked-mode-based selector 120b to select the first divided clock signal CLK_DIV1 as a selected clock signal when receiving, from the data output buffer DBuf, a command representing that the data output operation need not be performed. As a frequency of a signal supplied to a delay line 130b increases, power consumption increases. Thus, power consumption may be decreased by providing the delay line 130b with the first divided clock signal CLK_DIV1 obtained by dividing the reference clock signal CLK_REF by 2 to have a lower frequency than that of the reference clock signal CLK_REF.

As illustrated in FIG. 3, a delay-locked loop circuit 100c may correspond to the delay-locked loop circuit 100a of FIG. 1. An operation of the delay-locked loop circuit 100c will be described in detail below. First, the delay-locked mode controller 170c may determine a delay-locked mode to be the second delay-locked mode when receiving, from a data output buffer DBuf, a command CMD2 instructing to perform the data output operation. In one exemplary implementation, the command CMD2 may be an initial command or a read command. The initial command may be received from a controller (not shown) which controls a semiconductor memory device including the delay-locked loop circuit 100*c* to set parameters related to an operation of the semiconductor memory device. The read command may be received form the controller to perform a read operation to read data stored in the semiconductor memory device.

In the second delay-locked mode, the delay-locked mode controller 170*c* may provide a first divider disable signal DIV_D1 to a first divider 122*c* to deactivate the first divider 122*c*. The delay-locked mode controller 170*c* may select the reference clock signal CLK_REF as a selected clock signal by providing a reference clock signal selection signal SCA2 to a first signal selector 124*c*, so that a delay-locked clock signal CLK_DLL may be generated to have the same frequency as an external clock signal CLK_EXT. Furthermore, the delay-locked mode controller 170*c* may activate the data output buffer DBuf by providing a buffer enable signal Buf_E to the data output buffer DBuf. Then the data output buffer DBuf may output data in synchronization with the delay-locked clock signal CLK_DLL.

As described above, the delay-locked mode controller 170*c* may control a first delay-locked-mode-based selector 120*c* to select the reference clock signal CLK_REF as a selected clock signal when receiving, from the Delay-Locked Controller 170*c*, the command SCA2 instructing to perform the data output operation. As described above, the delay-locked loop circuit 100*c* may continuously perform a delay-locked loop operation on the basis of the first delay-locked mode, and perform the delay-locked loop operation on the basis of the second delay-locked mode when the delay-locked mode controller 170*c* determines the delay-locked mode to be the second delay-locked mode. Thus, a locking time required for the data output buffer DBuf to generate the delay-locked clock signal CLK_DLL to output data may be decreased. When the locking time is decreased, an operating speed of a semiconductor memory device including the delay-locked loop circuit 100*c* according to a command may be increased.

FIG. 4A is a timing diagram illustrating a delay-locked loop operation of the delay-locked loop circuit 100*b* of FIG. 2. Here, it is assumed that each of a first divided clock signal CLK_DIV1, a delay-locked clock signal CLK_DLL, and a feedback clock signal CLK_FB has a frequency that is half that of an external clock signal CLK_EXT and a reference clock signal CLK_REF.

Referring to FIGS. 2 and 4A, the delay-locked mode controller 170*b* may control the first delay-locked-mode-based selector 120*b* to select, as a selected clock signal SCLK, the first divided clock signal CLK_DIV1 obtained by the reference clock signal CLK_REF by ½. The first divided clock signal CLK_DIV1 may be delayed while passing through the delay line 130*b* and the replica unit 140*b* to generate the feedback clock signal CLK_FB. The delay-locked loop circuit 100*b* may generate the delay-locked clock signal CLK_DLL by comparing the phases of the reference clock signal CLK_REF and the feedback clock signal CLK_FB having different frequencies with each other and performing the delay-locked loop operation until the phases of the reference clock signal CLK_REF and the feedback clock signal CLK_FB become the same or substantially the same. Since the data output buffer DBuf is in an inactive state, data DOUT output from the data output buffer DBuf may be logic low. As described above, the first divided clock signal CLK_DIV1 generated by dividing the frequency of the reference clock signal CLK_REF by 2 and may be provided to the delay line 130*b* to decrease power consumption when the delay-locked loop operation is performed in the first delay-locked mode.

FIG. 4B is a timing diagram illustrating a delay-locked loop operation of the delay-locked loop circuit 100*c* of FIG. 3. Here, it is assumed that a reference clock signal CLK_REF, a delay-locked clock signal CLK_DLL, a feedback clock signal CLK_FB, and output data DOUT have the same frequency as an external clock signal CLK_EXT.

Referring to FIGS. 3 and 4B, the delay-locked mode controller 170*c* may control the first delay-locked-mode-based selector 120*c* to select the reference clock signal CLK_REF as a selected clock signal SCLK. The reference clock signal CLK_REF may be delayed while passing through the delay line 130*c* and the replica unit 140*c* to generate the feedback clock signal CLK_FB. The delay-locked loop circuit 100*c* may generate the delay-locked clock signal CLK_DLL by comparing the phases of the reference clock signal CLK_REF and the feedback clock signal CLK_FB having the same frequency with each other and performing the delay-locked loop operation until the phases of the reference clock signal CLK_REF and the feedback clock signal CLK_FB become the same or substantially the same. Since the first divider 122 is in the inactive state, the first divided clock signal CLK_DIV1 may be logic low.

Figure 5:
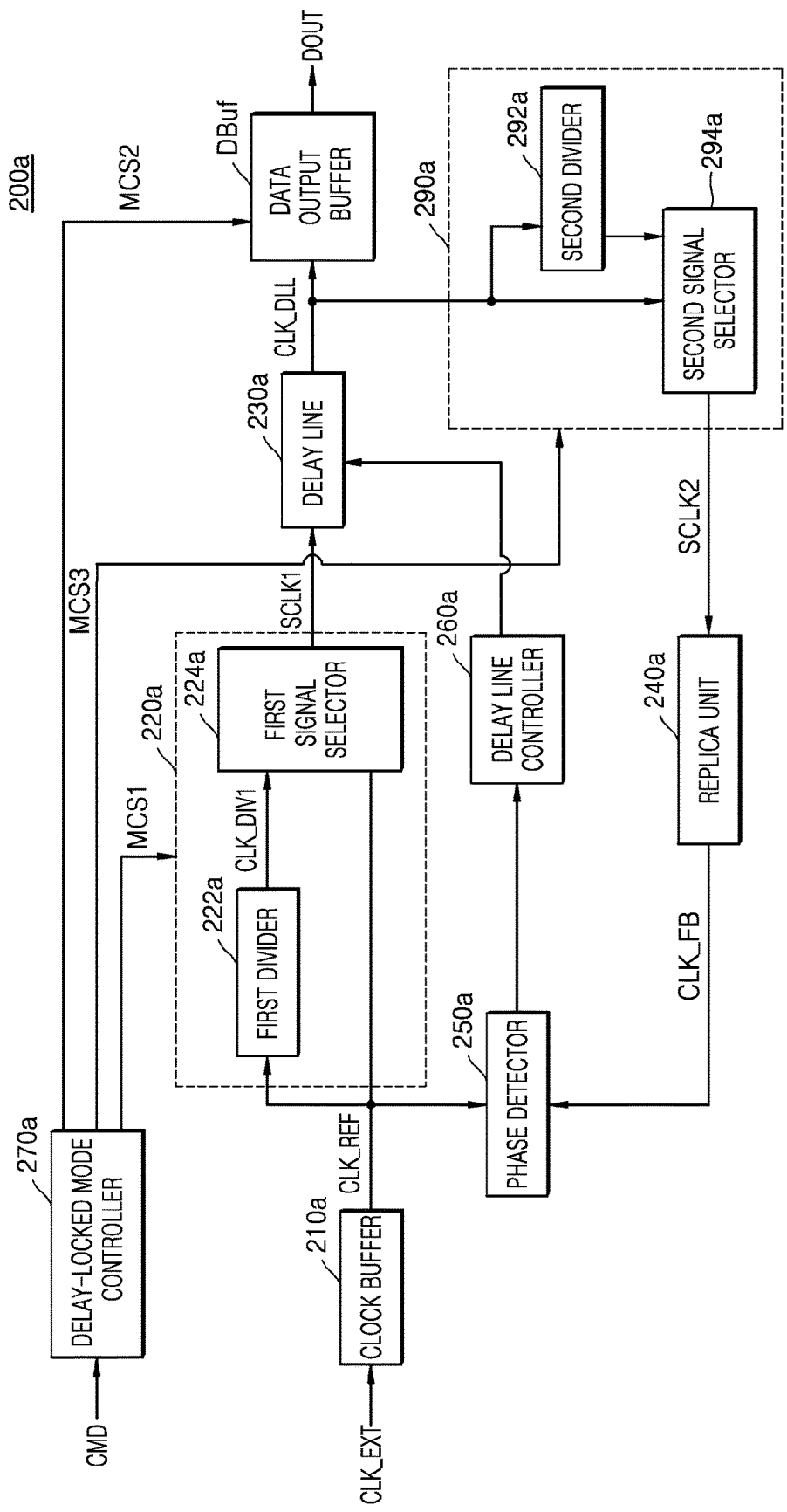
FIG. 5 is a block diagram of a delay-locked loop circuit according to another exemplary implementation.

FIG. 5 is a block diagram of a delay-locked loop circuit 200*a* according to another exemplary implementation. As illustrated in FIG. 5, the delay-locked loop circuit 200*a* has substantially the same structure as the delay-locked loop circuit 100*a* of FIG. 1 but may further include a second delay-locked-mode-based selector 290 compared to the delay-locked loop circuit 100*a* 1. The delay-locked loop circuit 200*a* will be described focusing on the differences from the delay-locked loop circuit 100*a* of FIG. 1 below.

A second delay-locked-mode-based selector 290*a* may include a second divider 292*a* and a second signal selector 294*a*. The second divider 292*a* may generate a second divided clock signal by dividing a delayed clock signal CLK_DLL, which is obtained by passing a first selected clock signal SCLK1 through a delay line 230*a*, by M. For example, the second divider 292*a* may divide the delayed clock signal CLK_DLL by M. Here, 'M' denotes an integer which is greater than or equal to '2'. The second signal selector 294*a* may select the delayed clock signal CLK_DLL or the second divided clock signal as a second selected clock signal SCLK2, and provide the second selected clock signal SCLK2 to a replica unit 240*a*. In one exemplary implementation, the second signal selector 294*a* may include at least one multiplexer (MUX) (not shown).

A delay-locked mode controller 270*a* may provide the second delay-locked-mode-based selector 290*a* with a third control signal MCS3 based on a determined delay-locked mode so as to control the second delay-locked-mode-based selector 290*a* to select the delayed clock signal CLK_DLL or the second divided clock signal as the second selected clock signal SCLK2.

The delay-locked loop circuit 200*a* according to an exemplary implementation is configured to provide a data output buffer DBuf with a delay-locked clock signal corresponding to the delayed clock signal CLK_DLL when the phase of the reference clock signal CLK_REF is the same as or substantially the same as that of the feedback clock signal CLK_FB. In this case, a path in which the reference clock signal CLK_REF passes through a first delay-locked-mode-based selector 220*a*, a delay line 230*a*, the second delay-locked-mode-based selector 290*a*, and a replica unit 240*a* may be referred to as a second delay-locked loop path. A semiconductor memory device may be configured to include the delay-locked loop circuit 200a and the data output buffer DBuf.

Figure 6:
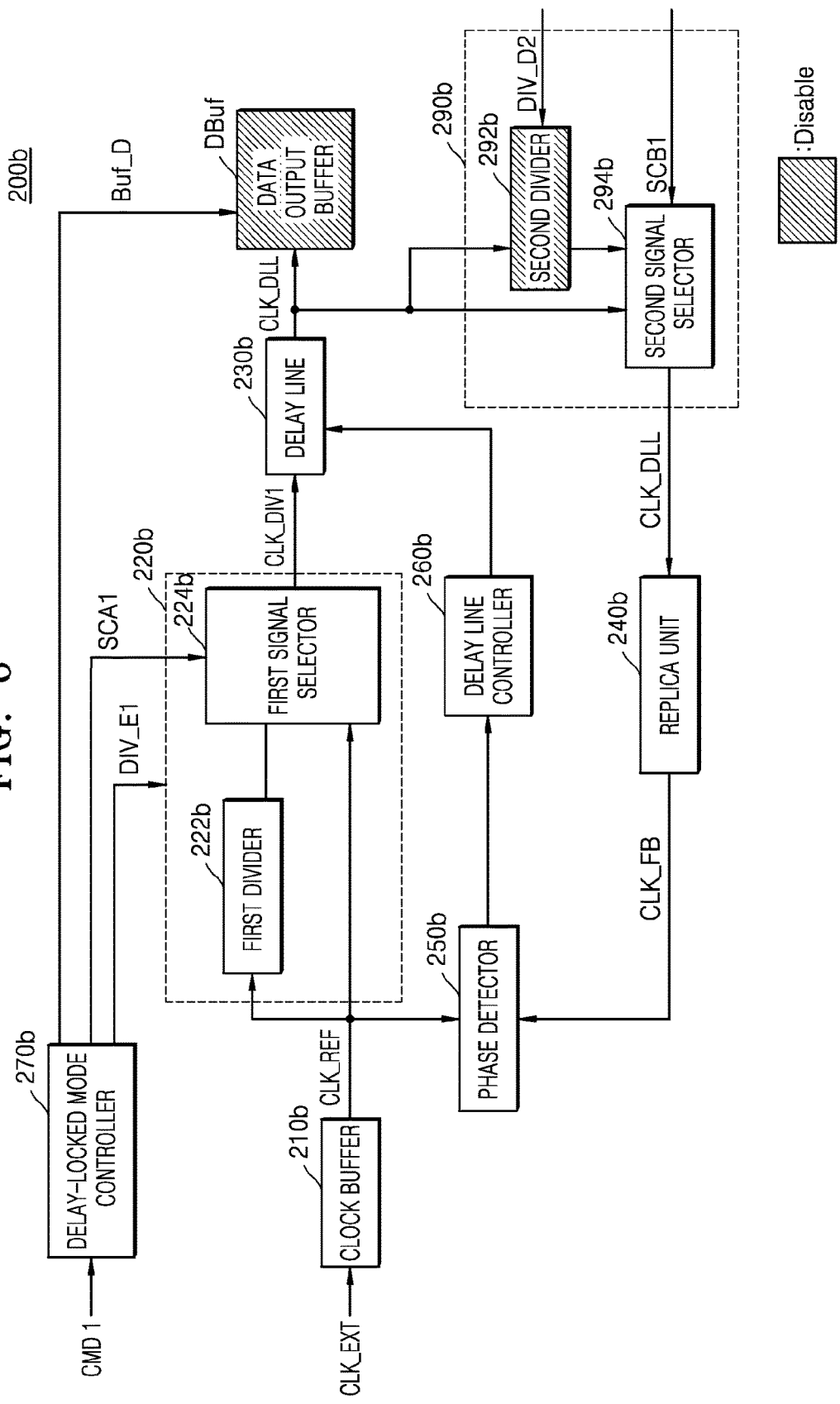
FIGS. 6 and 7 are block diagrams illustrating delay-locked loop operations of delay-locked loop circuits according to other exemplary implementations.
Figure 7:
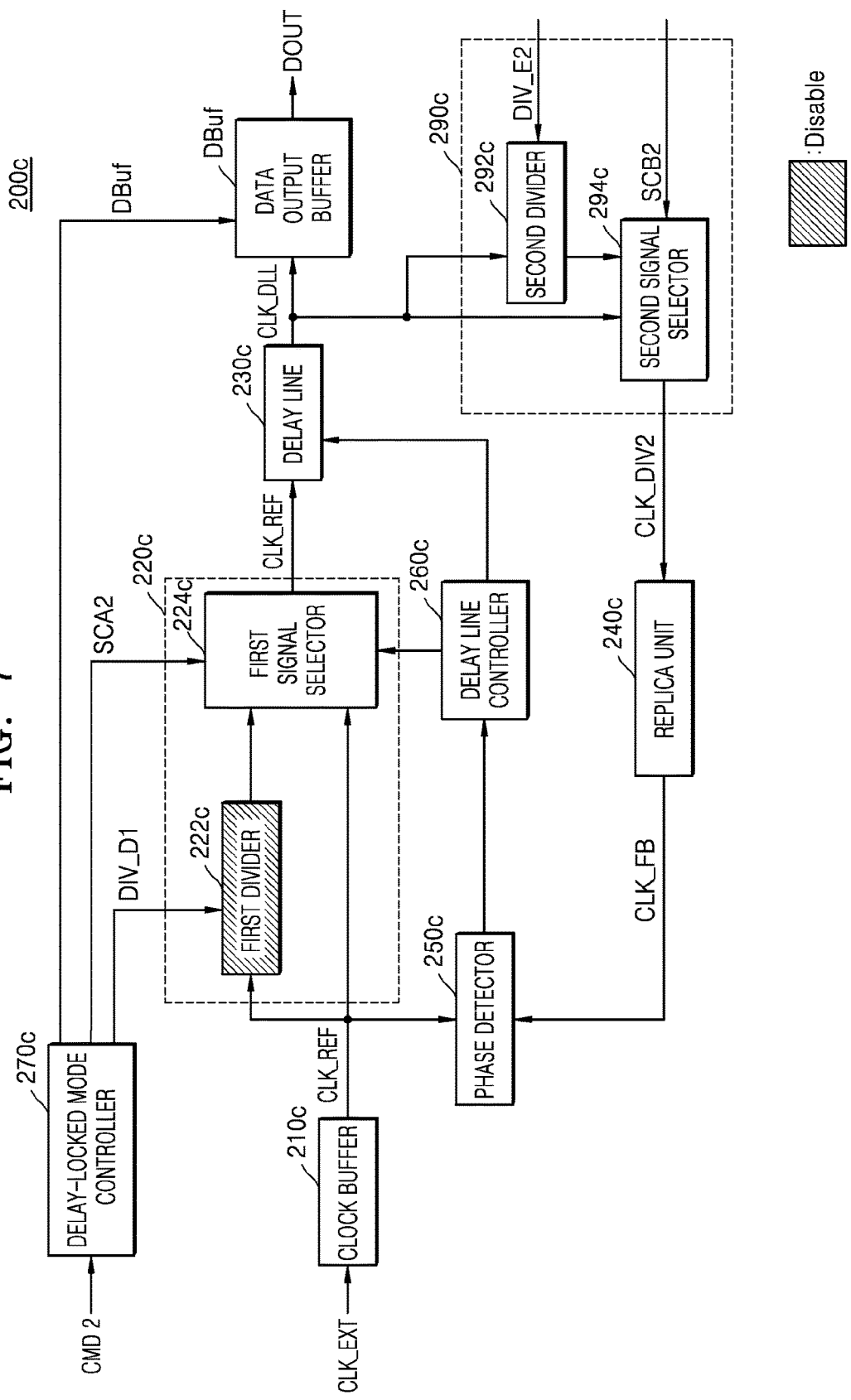
Figure 8A:
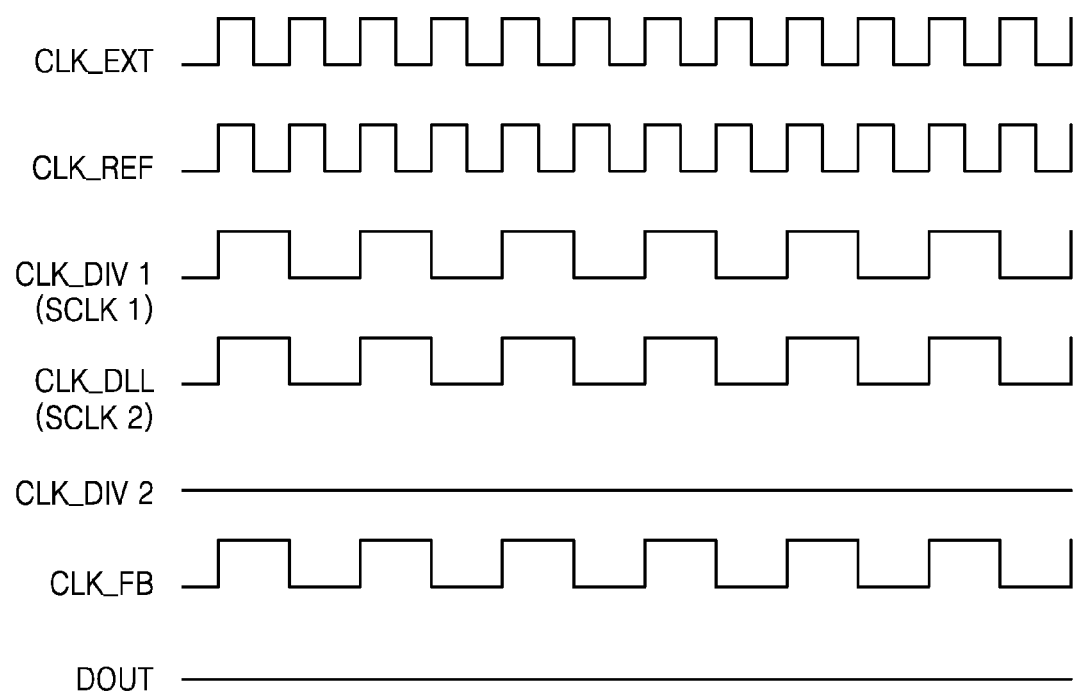
FIGS. 8A and 8B are timing diagrams illustrating delay-locked loop operations of delay-locked loop circuits according to other exemplary implementations.
Figure 8B:
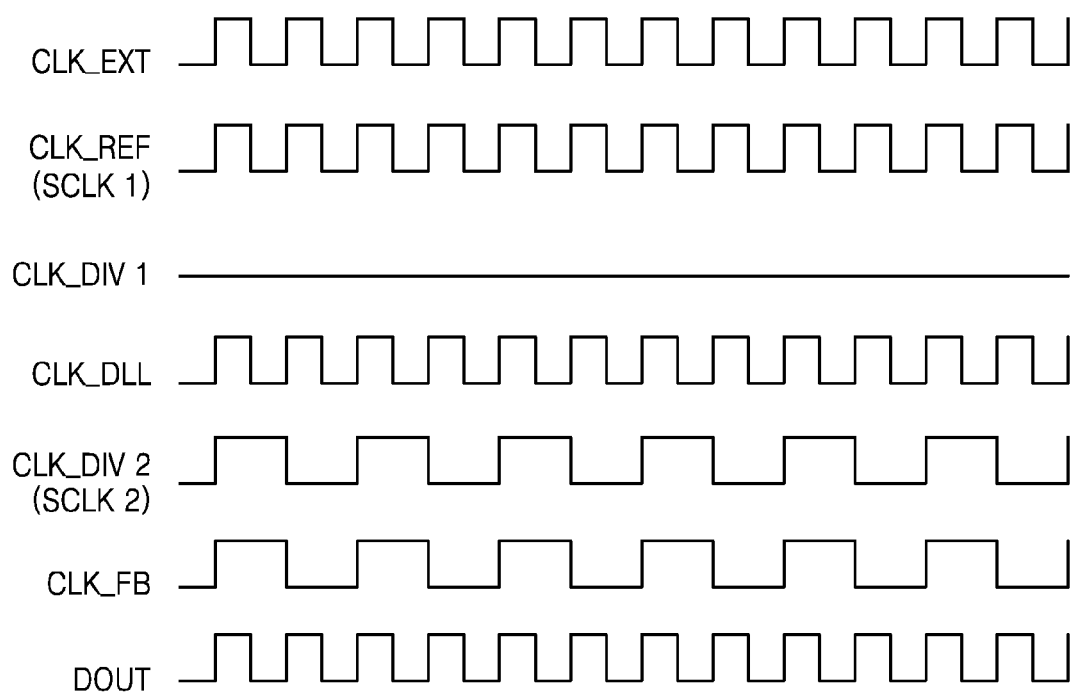

FIGS. 6 and 7 are block diagrams illustrating delay-locked loop operations of delay-locked loop circuits according to other exemplary implementations. FIGS. 8A and 8B are timing diagrams illustrating delay-locked loop operations of delay-locked loop circuits according to other exemplary implementations.

As illustrated in FIG. 6, a delay-locked loop circuit 200b may correspond to the delay-locked loop circuit 200a of FIG. 5. An operation of the delay-locked loop circuit 200b will be described below. A delay-locked mode controller 290b may provide a second divider disable signal DIV_D2 to a second divider 292b to deactivate the second divider 292b when a delay-locked mode is determined to be the first delay-locked mode, as described above with reference to FIG. 2. The delay-locked mode controller 270b may provide a delayed clock signal selection signal SCB1 to a second signal selector 294b so as to select a delayed clock signal CLK_DLL as a second selected clock signal.

When a feedback clock signal CLK_FB is generated by dividing the delayed clock signal CLK_DLL, which is obtained by passing a first divided clock signal CLK_DIV1 through a delay line 230b, by 2 and then passing a result of dividing the delayed clock signal CLK_DLL by 2 through a replica unit 240b, a time required for a phase detector 250b to perform a phase comparison increases may be increased due to the feedback clock signal CLK_FB having a low frequency, thereby increasing a locking time. Thus, in order to prevent the locking time from being increased, the delay-locked mode controller 270b may control the second delay-locked-mode-based selector 290b to select the delayed clock signal CLK_DLL as the second selected clock signal.

As illustrated in FIG. 7, a delay-locked loop circuit 200c may correspond to the delay-locked loop circuit 200a of FIG. 5. An operation of the delay-locked loop circuit 200c will be described in detail below. The delay-locked mode controller 270c may provide a second divider enable signal DIV_E2 to a second divider 292c so as to activate the second divider 292c when a delay-locked mode is determined to be the second delay-locked mode, as described above with reference to FIG. 2. Thus, the second divider 292c may generate a second divided clock signal CLK_DIV2 by dividing a delayed clock signal CLK_DLL by 2. The delay-locked mode controller 270c may provide a second signal selector 294c with a second divided clock signal selection signal SCB2 to select the second divided clock signal CLK_DIV2 as a second selected clock signal.

As described above, the delay-locked mode controller 270c may control a second delay-locked-mode-based selector 290c to select the second divided clock signal CLK_DIV2 as the second selected clock signal when receiving, from a data output buffer DBuf, a command instructing to perform the data output operation. As the frequency of a signal supplied to a replica unit 240c increases, power consumption increases. Thus, the second divided clock signal CLK_DIV2, which is generated by dividing the delayed clock signal CLK_DLL by 2 to have a lower frequency than that of the delayed clock signal CLK_DLL, may be provided to the replica unit 240c, thereby decreasing power consumption.

FIG. 8A is a timing diagram illustrating a delay-locked loop operation of the delay-locked loop circuit 200b of FIG. 6. Here, it is assumed that each of a first divided clock signal CLK_DIV1, a delay-locked clock signal CLK_DLL, and a feedback clock signal CLK_FB has a frequency that is half those of an external clock signal CLK_EXT and a reference clock signal CLK_REF. Also, the delay-locked clock signal CLK_DLL may be obtained by comparing the phases of the reference clock signal CLK_REF and the feedback clock signal CLK_FB having different frequencies with each other and performing the delay-locked loop operation by the delay-locked loop circuit 200b until the phases of the reference clock signal CLK_REF and the feedback clock signal CLK_FB become the same or substantially the same.

Referring to FIGS. 6 and 8A, the delay-locked mode controller 270b may control the first delay-locked-mode-based selector 220b to select the first divided clock signal CLK_DIV1, which is obtained by dividing the reference clock signal CLK_REF by ½, as a first selected clock signal SCLK1. Also, the delay-locked mode controller 270b may control the second delay-locked-mode-based selector 290b to select the delay-locked clock signal CLK_DLL as a second selected clock signal SCLK2. Thus, the first divided clock signal CLK_DIV1 may be delayed while passing through the delay line 230b and the replica unit 240b to generate the feedback clock signal CLK_FB. A second divided clock signal CLK_DIV2 may be logic low since the second divider 292b is in the inactive state, and output data DOUT may be logic low since the data output buffer DBuf is in the inactive state.

As described above, the first divided clock signal CLK_DIV1 obtained by dividing the frequency of the reference clock signal CLK_REF by ½ may be provided to the delay line 230b and thus power consumption may decrease when the delay-locked loop operation is performed in the first delay-locked mode. Also, a delayed clock signal which is not obtained by dividing the reference clock signal CLK_REF by 2 may be provided to the replica unit 240b, thereby preventing a locking time of the delay-locked loop circuit 200b from being increased.

FIG. 8B is a timing diagram illustrating a delay-locked loop operation of the delay-locked loop circuit 200c of FIG. 7. Here, it is assumed that a reference clock signal CLK_REF, a delay-locked clock signal CLK_DLL, and output data DOUT have the same frequency as that of an external clock signal CLK_EXT and a second divided clock signal CLK_DIV2 and a feedback clock signal CLK_FB each have a frequency that is half that of the external clock signal CLK_EXT. The delay-locked clock signal CLK_DLL may be obtained by comparing the phases of the reference clock signal CLK_REF and the feedback clock signal CLK_FB having different frequencies with each other and performing the delay-locked loop operation by the delay-locked loop circuit 200c until the phases of the reference clock signal CLK_REF and the feedback clock signal CLK_FB become the same or substantially the same.

Referring to FIGS. 7 and 8B, the delay-locked mode controller 270c may control the first delay-locked-mode-based selector 220c to select the reference clock signal CLK_REF as a first selected clock signal. Also, the delay-locked mode controller 270c may control the second delay-locked-mode-based selector 290c to select, as a second selected clock signal SCLK2, the second divided clock signal CLK_DIV2 obtained by dividing the delay-locked clock signal CLK_DLL by ½. The second divided clock signal CLK_DIV2 may be delayed while passing through the replica unit 240c to generate the feedback clock signal CLK_FB. Since the first divider 222c is in the inactive state, the first divided clock signal CLK_DIV1 may be logic low.

Figure 9A:
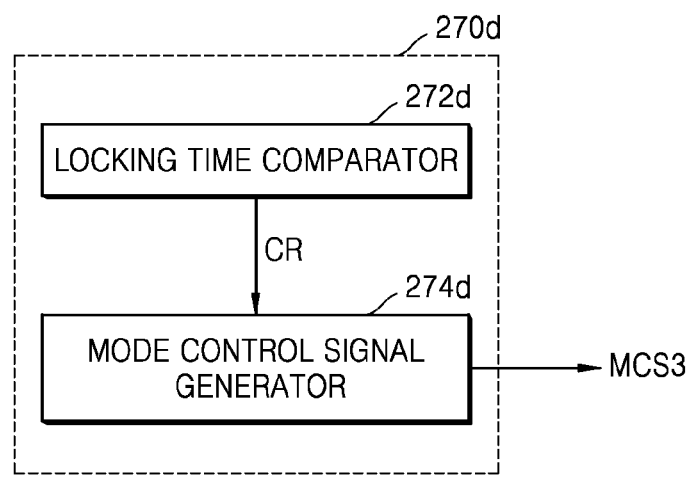
FIG. 9A is a block diagram of a delay-locked mode controller according to an exemplary implementation.

FIG. 9A is a block diagram of a delay-locked mode controller 270d according to an exemplary implementation.

Figure 9B:
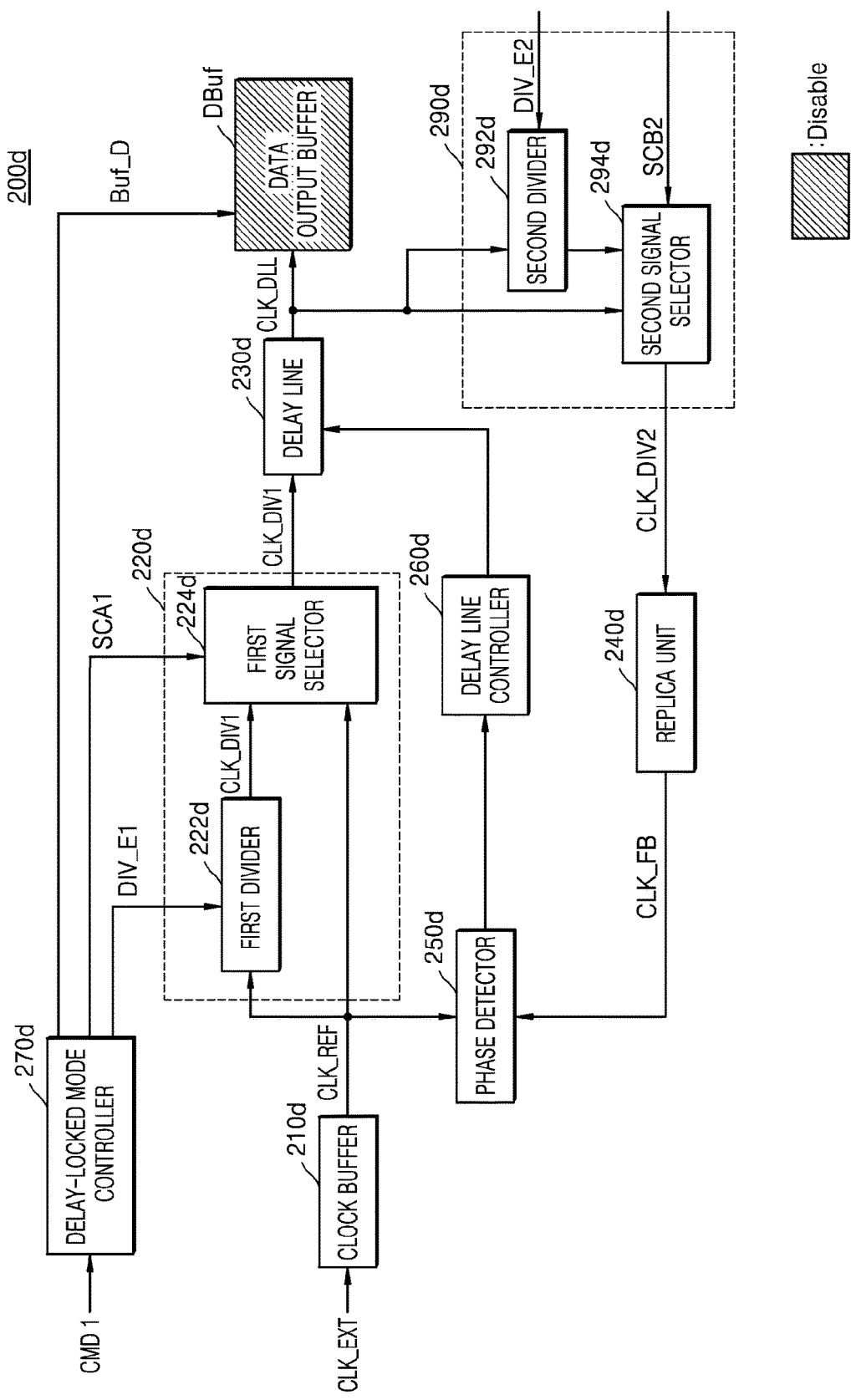
FIG. 9B is a block diagram illustrating an operation of a delay-locked loop circuit including the delay-locked mode controller of FIG. 9A according to an exemplary implementation.

FIG. 9B is a block diagram illustrating an operation of a delay-locked loop circuit including the delay-locked mode controller 270d of FIG. 9A according to an exemplary implementation.

As illustrated in FIG. 9A, the delay-locked mode controller 270d may include a locking time comparator 272d and a mode control signal generator 274d. As described above with reference to FIG. 6, a locking time may increase when a feedback clock signal CLK_FB is generated by dividing a delayed clock signal CLK_DLL, which is generated by passing a first divided clock signal CLK_DIV1 through the delay line 230b, by 2 and passing a result of delaying the dividing a delayed clock signal CLK_DLL through the replica unit 240b. However, when the locking time does not increase to a reference time or more, it may be more efficient to decrease power consumption by selecting a second divided clock signal CLK_DIV2 as a second selected signal and providing the second selected signal to the replica unit 240b.

In one exemplary implementation, the locking time comparator 272d may compare the locking time with the reference time to obtain a comparison result CR and provide the comparison result CR to the mode control signal generator 274d. The mode control signal generator 274d may provide a second delay-locked-mode-based selector 290d with a third control signal MCS3 for controlling the second delay-locked-mode-based selector 290d on the basis of the comparison result CR.

As illustrated in FIGS. 9A and 9B, when a delay-locked mode is determined to be the first delay-locked mode, the delay-locked mode controller 270d may provide a second divider disable signal DIV_E2 to a second divider 292d so as to activate the second divider 292, unlike that illustrated in FIG. 6. The delay-locked mode controller 270d may provide a second divided clock signal selection signal SCB2 to the second signal selector 294d to select the second divided clock signal CLK_DIV2 as a second selected clock signal. The locking time comparator 272d may compare a locking time spent in the delay-locked loop circuit 200d of FIG. 9B in the first delay-locked mode with a reference time. When the locking time is greater than or equal to the reference time, the delay-locked mode controller 270d may deactivate the second divider 292d and control the second signal selector 294 to select the delayed clock signal CLK_DLL. When the locking time is less than the reference time, the delay-locked mode controller 270d may control a current operation to be continuously performed.

As described above, the delay-locked mode controller 270d may dynamically control the second delay-locked-mode-based selector 290d on the basis of a result of comparing the locking time with the reference time, and may greatly decrease power consumption during the delay-locked loop operation while guaranteeing a minimum locking time.

Figure 10:
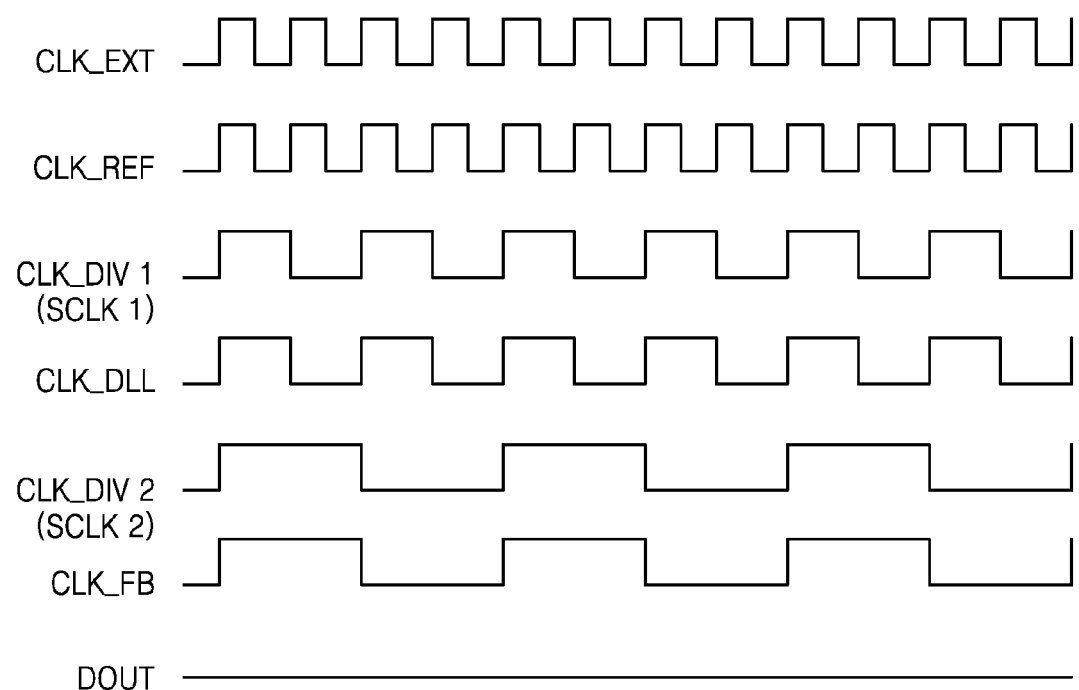
FIG. 10 is a timing diagram illustrating a delay-locked loop operation of the delay-locked loop circuit of FIG. 9B according to an exemplary implementation.

FIG. 10 is a timing diagram illustrating a delay-locked loop operation of delay-locked loop circuit 200d of FIG. 9B according to an exemplary implementation. Here, it is assumed that a first divided clock signal CLK_DIV1 and a delay-locked clock signal CLK_DLL each have a frequency that is half those of an external clock signal CLK_EXT and a reference clock signal CLK_REF, and a second divided clock signal CLK_DIV2 and a feedback clock signal CLK_FB each have a frequency that is one fourth of those of the external clock signal CLK_EXT and the reference clock signal CLK_REF. The delay-locked clock signal CLK_DLL may be generated by comparing the phases of the reference clock signal CLK_REF and the feedback clock signal CLK_FB having different frequencies with each other and performing the delay-locked loop operation by the delay-locked loop circuit 200d until the phases of the reference clock signal CLK_REF and the feedback clock signal CLK_FB become the same or substantially the same.

As shown in FIGS. 9B and 10, the delay-locked mode controller 270d may control the first delay-locked-mode-based selector 220d to select a first divided clock signal CLK_DIV1, which is obtained by dividing a reference clock signal CLK_REF by ½, as a first selected clock signal SCLK1. Also, the delay-locked mode controller 270d may control the second delay-locked-mode-based selector 290d to select a second divided clock signal CLK_DIV2, which is obtained by dividing a delay-locked clock signal CLK_DLL by ½, as a second selected clock signal SCLK2. Thus, when the second divided clock signal CLK_DIV2 passes through the replica unit 240d, the second divided clock signal CLK_DIV2 is delayed to generate a feedback clock signal CLK_FB. Since a data output buffer DBuf is in the inactive state, output data DOUT output from the data output buffer DBuf may be logic low.

As described above, the first divided clock signal CLK_DIV1 obtained by dividing the frequency of the reference clock signal CLK_REF by 2 may be provided to the delay line 230d and the second divided clock signal CLK_DIV2 obtained by dividing the frequency of the delay-locked clock signal CLK_DLL by 2 may be provided to the replica unit 240d so as to decrease power consumption when the delay-locked loop operation is performed in the first delay-locked mode.

Figure 11A:
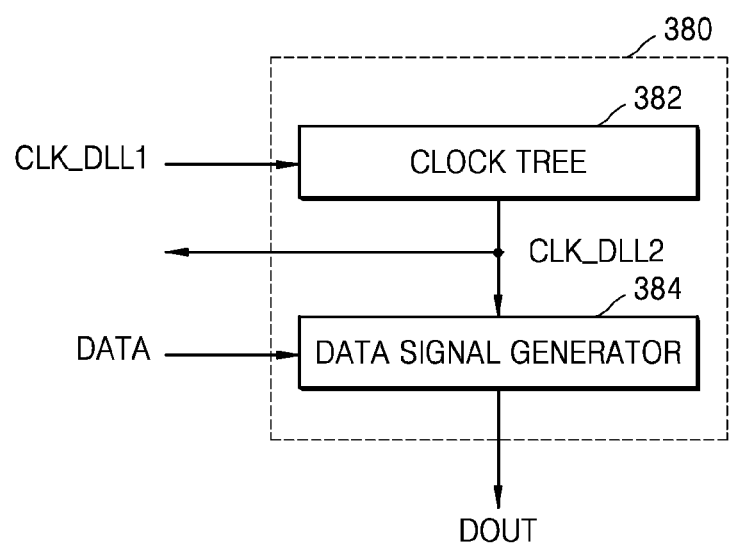
FIG. 11A is a block diagram of a data output buffer according to an exemplary implementation.

FIG. 11A is a block diagram of a data output buffer 380 according to an exemplary implementation. FIG. 11B is a detailed block diagram of a data output buffer 380 such as the data output buffer 380 of FIG. 11A.

As illustrated in FIG. 11A, the data output buffer 380 may include a clock tree 382 and a data signal generator 384. The clock tree 382 may be a circuit for controlling skew between clock signals. When a first delayed clock signal CLK_DLL1 received from the outside passes through the clock tree 382, the first delayed clock signal CLK_DLL1 may be delayed by the amount of delay corresponding to delay characteristics of the clock tree 382 to generate a second delayed clock signal CLK_DLL2. The second delayed clock signal CLK_DLL2 may be provided to a delay-locked loop circuit (not shown) to generate a delay-locked clock signal. The data signal generator 384 may receive data DATA from the outside, and output data DOUT in synchronization with the second delayed clock signal CLK_DLL2.

As illustrated in FIG. 11B, the data output buffer 380 may include a clock tree 382 and a plurality of data signal generators DG1 to DG14. The clock tree 382 may include a plurality of delay devices A. The plurality of delay devices A may be arranged such that a second delayed clock signal CLK_DLL2 having the same phase may be provided to the plurality of data signal generators DG1 to DG14. For example, the clock tree 382 may be configured such that a first delayed clock signal CLK_DLL1 may pass through three delay devices A of the clock tree 382 until the first delayed clock signal CLK_DLL1 reaches each of the plurality of data signal generators DG1 to DG14. The plurality of data signal generators DG1 to DG14 may respectively output a plurality of pieces of data DATA0 to DATA14 to DQ0 to 7 pads and UDQ0 to 7 pads thereof, in synchronization with the second delayed clock signal CLK_DLL2. The data output buffer 380 of FIG. 11b is merely an exemplary implementation and thus the inventive concept is not limited thereto. The data output buffer 380b may have further additional data signal generators and the plurality of delay devices A of the clock tree 382 may be arranged in various ways.

Figure 12:
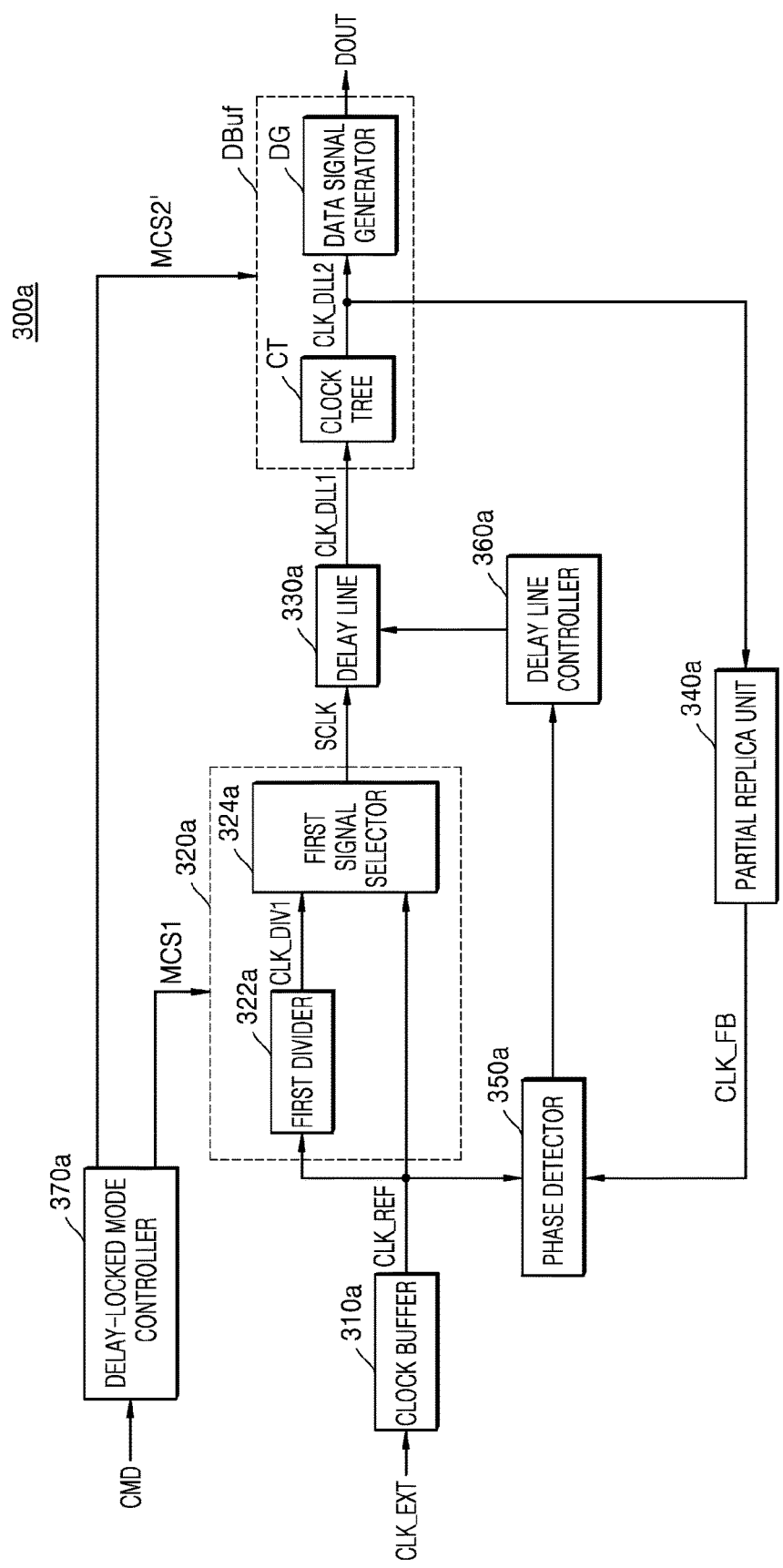
FIG. 12 is a block diagram of a delay-locked loop circuit to which the data output buffer of FIG. 11A is applied, according to another exemplary implementation.

FIG. 12 is a block diagram of a delay-locked loop circuit 300a to which the data output buffer 380 of FIG. 11A is applied, according to another exemplary implementation. As illustrated in FIG. 12, the delay-locked loop circuit 300a has substantially the same structure as the delay-locked loop circuit 100a of FIG. 1 but may have a different delay-locked loop path from that of the delay-locked loop circuit 100a and may further include a partial replica unit 340a, which may be a replica circuit. The delay-locked loop circuit 300a will now be described focusing on the differences of the delay-locked loop circuit 100a.

Unlike the first delay-locked loop path of the delay-locked loop circuit 100a of FIG. 1, a reference clock signal CLK_REF of the delay-locked loop circuit 300a may have a third delay-locked loop path in which the reference clock signal CLK_REF passes through a delay-locked-mode-based selector 320a, a delay line 330a, a clock tree CT, and the partial replica unit 340a. For example, the third delay-locked loop path for generating a delay-locked clock signal may include a path passing through the clock tree CT. Thus, the clock tree CT may be connected to an output terminal of the delay line 330a, and a first delayed clock signal CLK_DLL1 delayed by the delay line 330a may pass through the clock tree CT. A second delayed clock signal CLK_DLL2 delayed while passing through the clock tree CT may pass through the partial replica unit 340a. A phase detector 350a may generate a phase comparison signal by comparing the phase of a feedback clock signal CLK_FB delayed while passing through the partial replica unit 340a with that of the reference clock signal CLK_REF. In the delay-locked loop circuit 300a, the delay line controller 360a may generate the second delayed clock signal CLK_DLL2 as a delay-locked clock signal having the same phase or substantially the same phase as those of the feedback clock signal CLK_FB and the reference clock signal CLK_REF by controlling the amount of delay of the delay line 330a on the basis of the phase comparison signal, and provide the second delayed clock signal CLK_DLL2 to the data signal generator DG.

The partial replica unit 340a may have delay characteristics copied from those of the data signal generator DG, unlike the replica unit 140a of FIG. 1, since the clock tree CT is included in the third delay-locked loop path. The amount of delaying a signal by passing the signal through the data signal generator DG may be the same or substantially the same as the amount of delaying the signal by passing the signal through the partial replica unit 340a. The partial replica unit 340a may generate the feedback clock signal CLK_FB by delaying the second delayed clock signal CLK_DLL2 by the amount of delay according to the copied delay characteristics.

The delay-locked mode controller 370a may provide a data output buffer DBuf with a second control signal MCS2' based on a determined delay-locked mode so as to individually control active/inactive states of the clock tree CT and the data signal generator DG, as will be described in detail below. A semiconductor memory device may be configured to include the delay-locked loop circuit 300a and the data output buffer DBuf.

The delay characteristics of the data output buffer DBuf may be difficult to be exactly copied to the replica unit 140a of FIG. 1, since the data output buffer DBuf has a relatively complicated structure. Thus, delay characteristics which are slightly different from the delay characteristics of the data output buffer DBuf may be copied to the replica unit 140a. Since the third delay-locked loop path of the delay-locked loop circuit 300a according to an exemplary implementation includes a path passing through the clock tree CT, only the delay characteristics of the data signal generator DG having a simpler structure as that of the data output buffer DBuf may be copied to the partial replica unit 340a. Thus, the delay characteristics of the data signal generator DG may be more easily copied to the partial replica unit 340a, thereby precisely performing a delay-locked loop operation.

Figure 13:
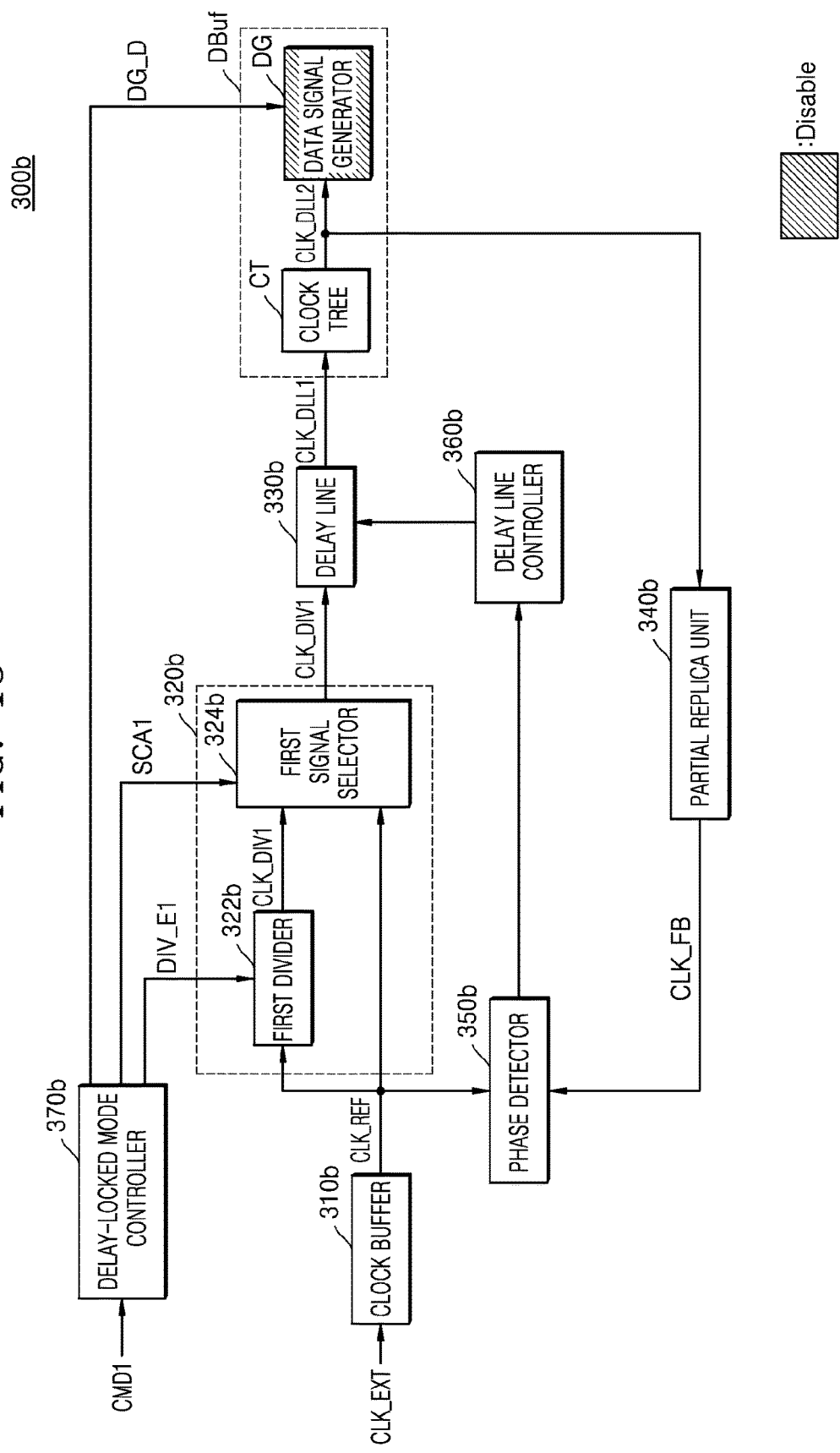
FIGS. 13 and 14 are block diagrams illustrating delay-locked loop operations of delay-locked loop circuits according to other exemplary implementations.
Figure 14:
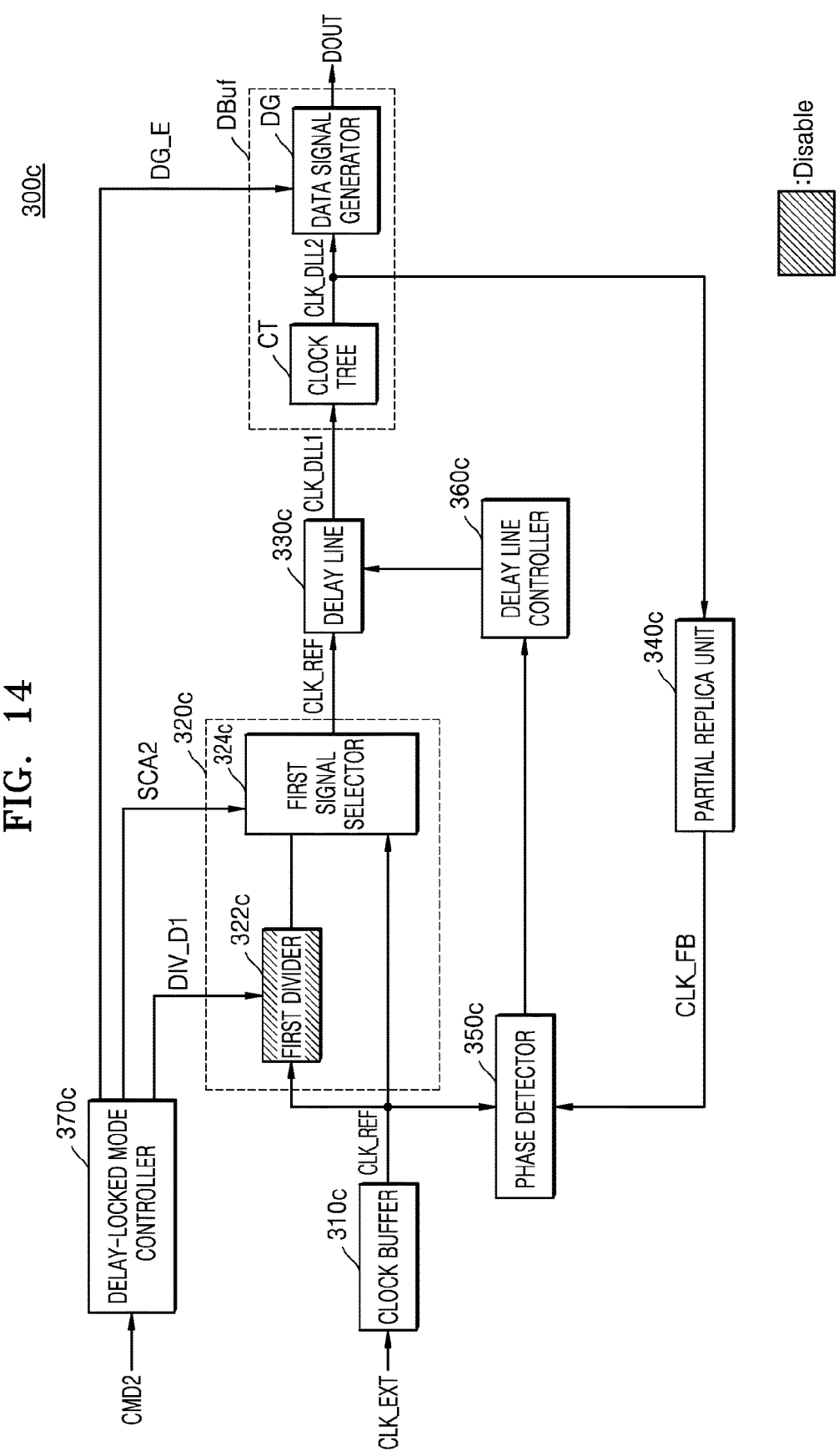

FIGS. 13 and 14 are block diagrams illustrating delay-locked loop operations of delay-locked loop circuits according to other exemplary implementations.

As illustrated in FIG. 13, operations of a delay-locked loop circuit 300b are substantially the same as those of the delay-locked loop circuit 100b of FIG. 2 and thus the delay-locked loop circuit 300b will now be described focusing on the differences from the delay-locked loop circuit 100b.

In the first delay-locked mode, a delay-locked mode controller 370b may provide a data generator disable signal DG_D to a data signal generator DG so as to deactivate the data signal generator DG. Furthermore, although not shown, the delay-locked mode controller 370b may activate a clock tree CT or control the clock tree CT to be maintained in the active state.

As illustrated in FIG. 14, operations of a delay-locked loop circuit 300c are substantially the same as those of the delay-locked loop circuit 100c of FIG. 3 and thus the delay-locked loop circuit 300c will now be described focusing on the differences from the delay-locked loop circuit 100c.

In the second delay-locked mode, a delay-locked mode controller 370c may provide a data generator enable signal DG_E to a data signal generator DG so as to activate the data signal generator DG. The data signal generator DG may output data DOUT in synchronization with a second delayed clock signal CLK_DLL2 corresponding to a delay-locked clock signal.

Figure 15:
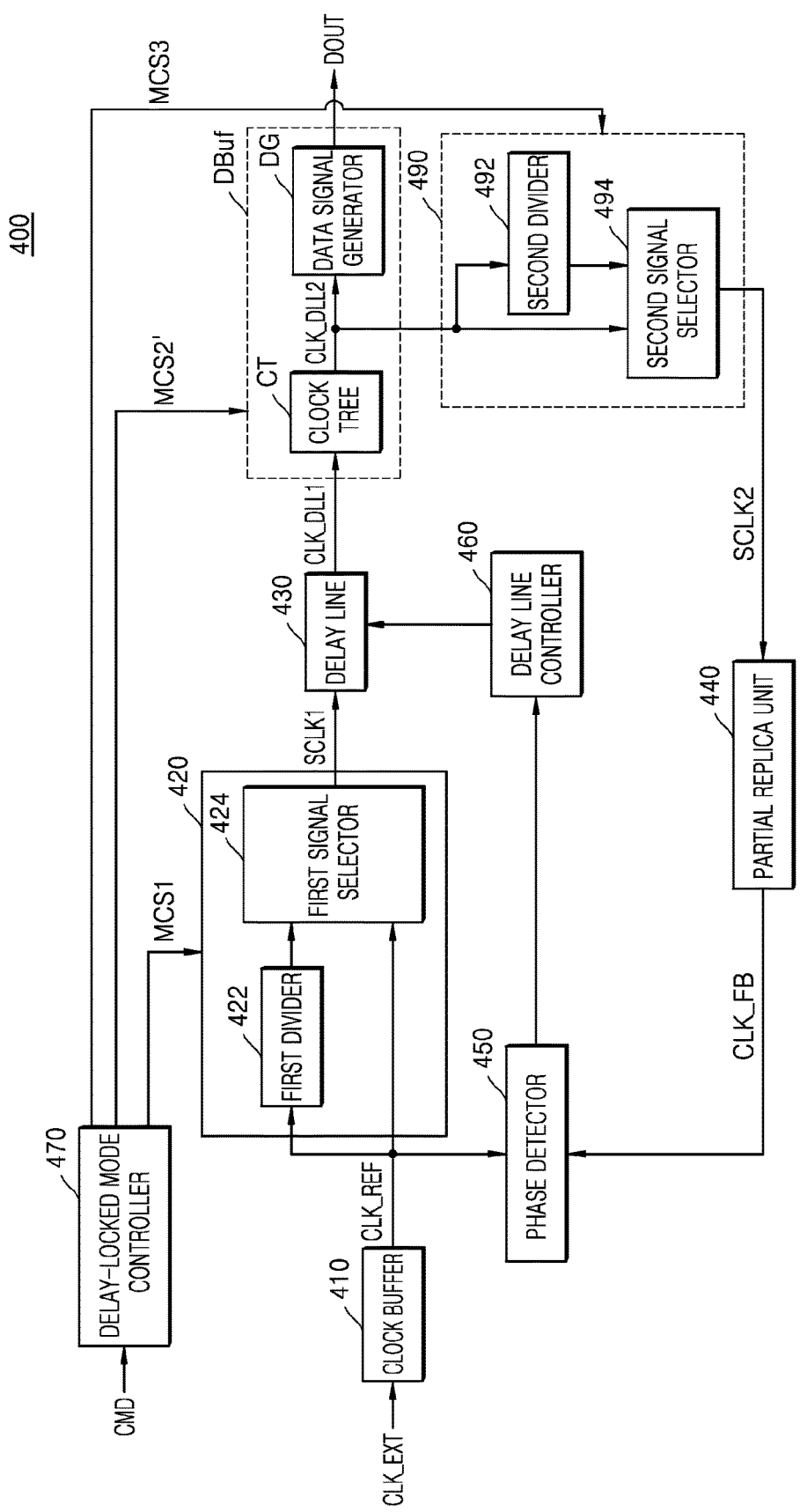
FIG. 15 is a block diagram of a delay-locked loop circuit according to an exemplary implementations.

FIG. 15 is a block diagram of a delay-locked loop circuit 400 according to an exemplary implementation. As illustrated in FIG. 15, the delay-locked loop circuit 400 has substantially the same structure as that of the delay-locked loop circuit 300a of FIG. 12 but may further include a second delay-locked-mode-based selector 490 compared to the delay-locked loop circuit 300a. In one exemplary implementation, the second delay-locked-mode-based selector 490 may be connected to an output terminal of a clock tree CT.

The second delay-locked-mode-based selector 490 may include a second divider 492 and a second signal selector 494. The second divider 492 may generate a second divided clock signal by dividing a second delayed clock signal CLK_DLL2, which is obtained by passing a first delayed clock signal CLK_DLL1 through the clock tree CT, by 2. The second signal selector 494 may select the second delayed clock signal CLK_DLL2 or the second divided clock signal as a second selected clock signal SCLK2, and provide the second selected clock signal SCLK2 to a partial replica unit 440. A delay-locked loop operation of the delay-locked loop circuit 400 is as described above in detail with reference to FIGS. 5 to 7 and is thus not described again here. Also, a semiconductor memory device may be configured to include the delay-locked loop circuit 400 and a data output buffer DBuf.

Figure 16:
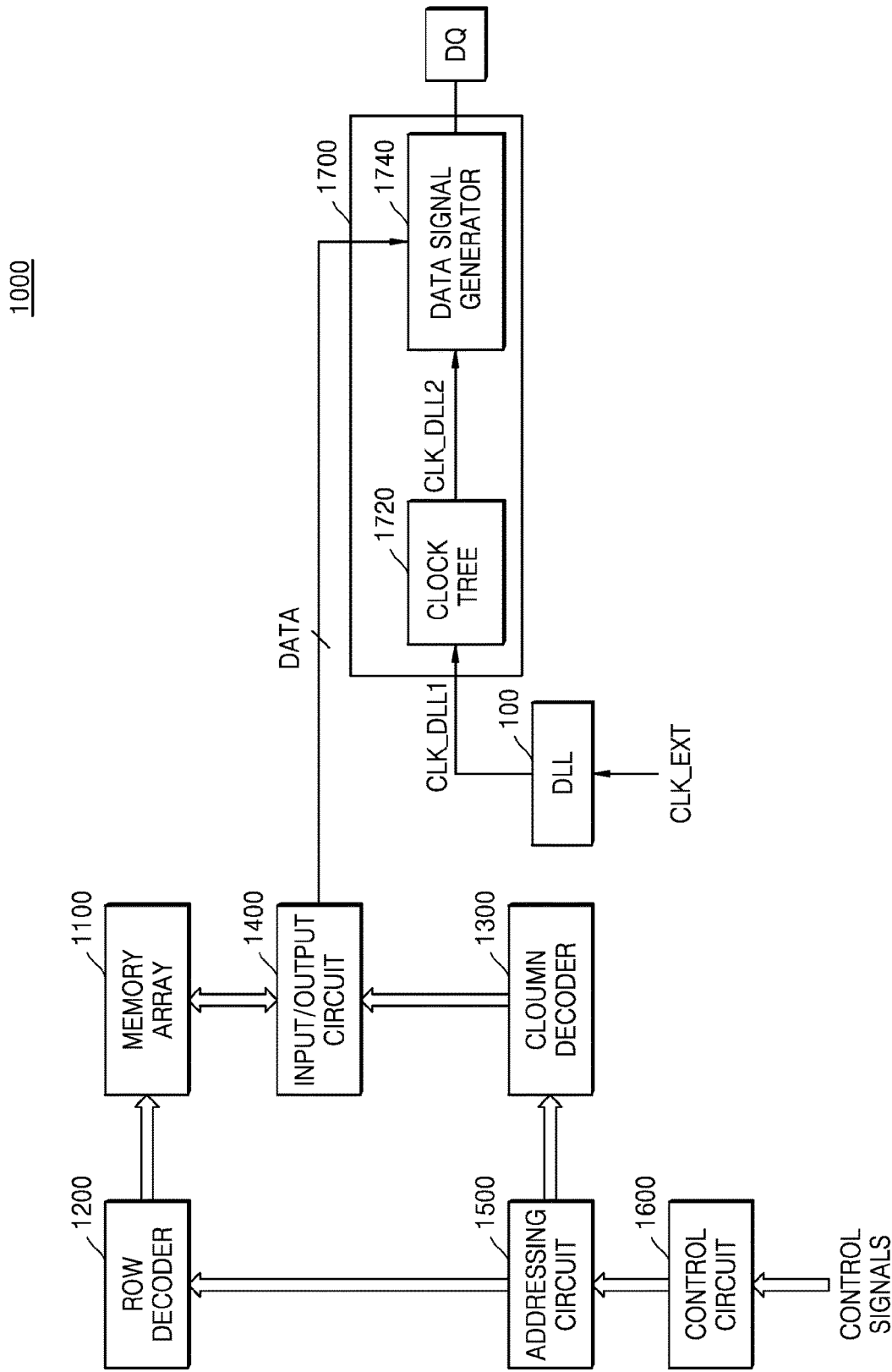
FIG. 16 is a block diagram of a semiconductor memory device according to an exemplary implementation.

FIG. 16 is a block diagram of a semiconductor memory device 1000 according to an exemplary implementation.

As illustrated in FIG. 16, the semiconductor memory device 1000 according to an exemplary implementation may include a delay-locked loop circuit 100, a memory array 1100, a row decoder 1200, a column decoder 1300, an input/output circuit 1400, an addressing circuit 1500, a control circuit 1600, and a data output buffer 1700.

The memory array 1100 may include a plurality of word lines, a plurality of bit lines, and a plurality of memory cells connected between the plurality of word lines and the plurality of bit lines. Each of the plurality of memory cells may be embodied as a volatile memory cell such as a random access memory (DRAM) or a synchronous dynamic random access memory (SDRAM).

Alternatively, each of the plurality of memory cells may be embodied as a nonvolatile memory cell. Examples of the nonvolatile memory cell may include a phase-change ram (PRAM), a nano floating gate memory (NFGM), a polymer RAM PoRAM), a magnetic RAM (MRAM), a ferroelectric RAM (FeRAM), a Resistive RAM (RRAM), a nanotube RRAM, a holographic memory, a molecular electronics memory device, and an insulator resistance change memory. The nonvolatile memory cell may store one bit or a plurality of bits.

The row decoder 1200 may receive a row address output from the addressing circuit 1500, decode the row address, and select one of the plurality of word lines. The column decoder 1300 may receive a column address output from addressing circuit 1500, decode the column address, and select one of the plurality of bit lines.

The input/output circuit 1400 may write data to at least one memory cell selected by the row decoder 1200 and the column decoder 1300. Also, the input/output circuit 1400 may read data stored in at least one memory cell selected by the row decoder 1200 and the column decoder 1300. The input/output circuit 1400 may include a plurality of sense amplifiers for sensing and amplifying data read during a read operation, and at least one output driver for driving data to be written during a write operation.

The addressing circuit 1500 may generate a row address and a column address under control of the control circuit 1600. The control circuit 1600 may generate a plurality of operation control signals for controlling an operation of the addressing circuit 1500 according to a plurality of control signals needed to perform the write operation or the read operation. The data output buffer 1700 may include a clock tree 1720 and a data signal generator 1740. The delay-locked loop circuit 100 may provide the data output buffer 1700 with a first delayed clock signal CLK_DLL1 corresponding to a delay-locked clock signal synchronized with an external clock signal CLK_EXT as described above with reference to FIGS. 1 to 10. The first delayed clock signal CLK_DLL1 may be delayed while passing through the clock tree 1720 to generate a second delayed clock signal CLK_DLL2. The data signal generator 1740 may output a data signal DATA to a DQ pad DQ according to the second delayed clock signal CLK_DLL2. Thus, the write operation or the read operation may be performed in synchronization with the second delayed clock signal CLK_DLL2. The DQ pad DQ is a pad of a semiconductor chip which is an exemplary implementation of a semiconductor memory device, and may be arranged on the semiconductor chip in the form of a center pad or an edge page. Also, as described above, the delay-locked loop circuit 100 may have a delay-locked loop path including a path passing through the clock tree 1720. The delay-locked clock signal may be generated from the second delayed clock signal CLK_DLL2.

Figure 17:
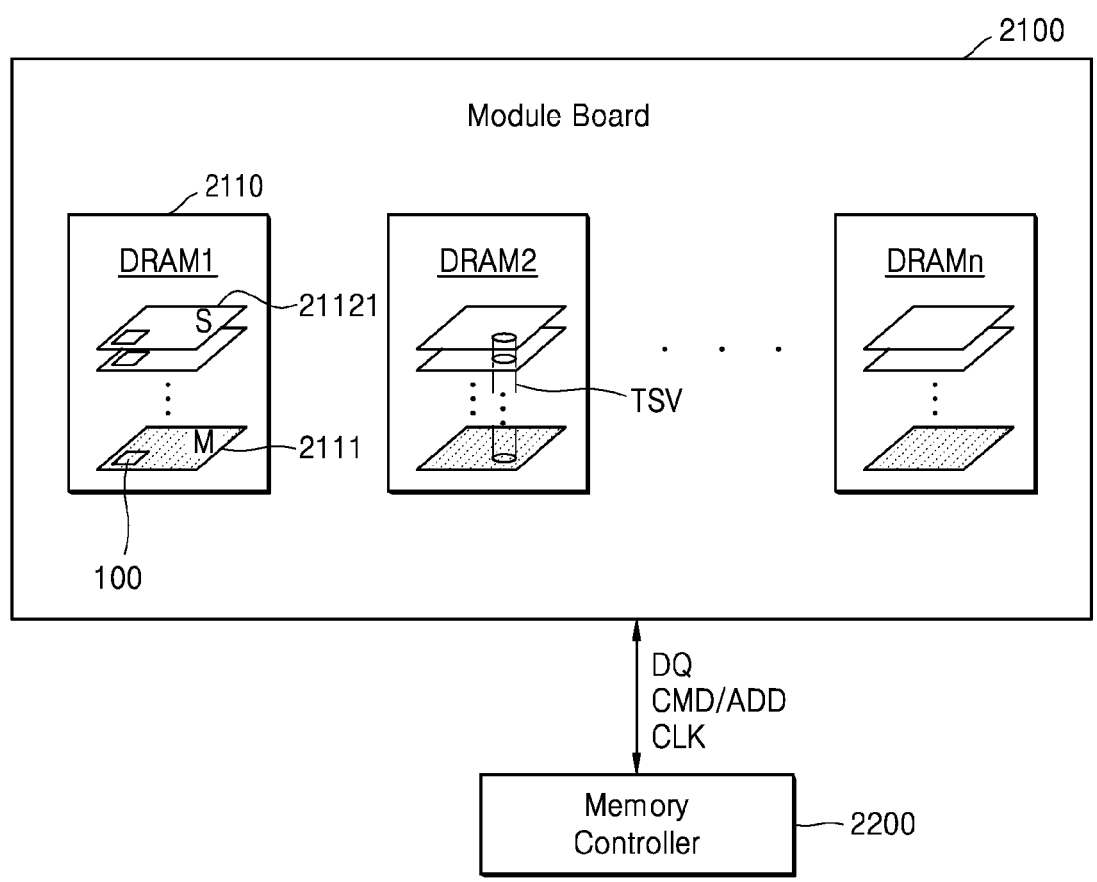
FIG. 17 is a diagram illustrating a memory system to which the semiconductor memory device of FIG. 16 is applied, according to an exemplary implementation.

FIG. 17 is a diagram illustrating a memory system 2000 to which the semiconductor memory device 1000 of FIG. 16 is applied, according to an exemplary implementation.

As illustrated in FIG. 17, the memory system 2000 may include a memory module 2100 and a memory controller 2200. In the memory module 2100, at least one semiconductor memory device 2110 may be mounted on a module board. The at least one semiconductor memory device 2110 may be embodied as a DRAM chip. Each of the at least one semiconductor memory device 2110 may include a plurality of semiconductor layers. The plurality of semiconductor layers may include at least one master chip 2111 and at least one slave chip 2112. A signal may be exchanged between the plurality of semiconductor layers via a through silicon via (TSV). Each of the at least one master chip 2111 and the at least one slave chip 2112 may include a memory array, a storage unit, and a refresh unit according to an exemplary implementation. Each of the at least one master chip 2111 and the at least one slave chip 2112 may further include a test unit. The at least one semiconductor memory device 2110 may include a delay-locked loop circuit as described above with reference to FIGS. 1 to 15 and may thus perform a delay-locked loop operation while decreasing power consumption and guaranteeing a locking time.

The memory module 2100 may communicate with the memory controller 2200 via a system bus. Data DQ, a command/address CMD/ADD, a clock signal CLK, and the like may be exchanged between the memory module 2100 and the memory controller 2200 via the system bus.

Figure 18:
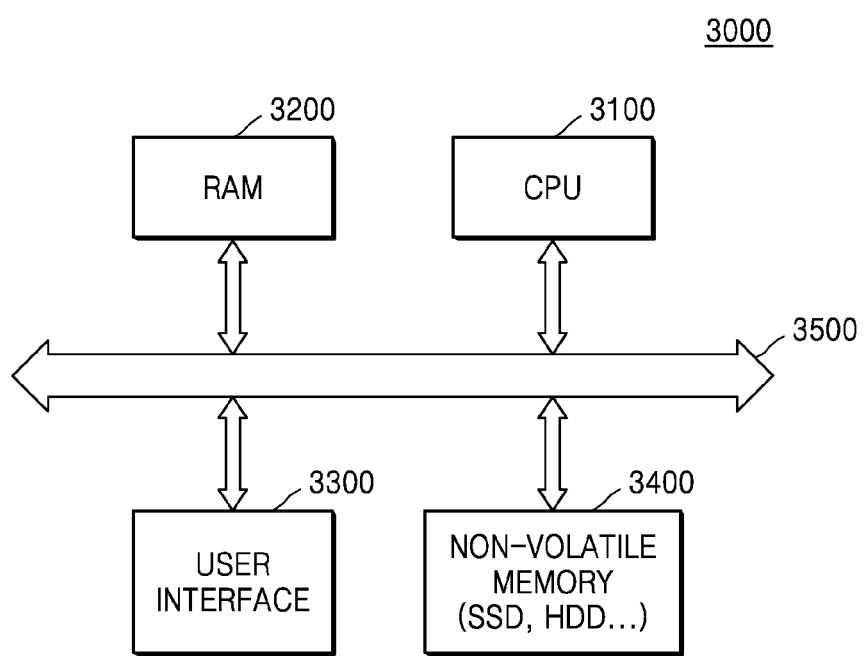
FIG. 18 is a block diagram of a computing system to which a memory system according to an exemplary implementation is mounted.

FIG. 18 is a block diagram of a computing system 3000 to which a memory system according to an exemplary implementation is mounted.

As shown in FIG. 18, a RAM 3200 which is a type of a semiconductor memory device according to an exemplary implementation may be mounted in the computing system 3000 such as a mobile device or a desktop computer. One of the exemplary implementations described above may be applied to the RAM 3200 which is a type of a semiconductor memory device. For example, the RAM 3200 may be applied as a semiconductor memory device according to one of the above exemplary implementations or may be applied in the form of a memory module. Also, the RAM 3200 may be a concept including a semiconductor memory device and a memory controller.

The computing system 3000 according to an exemplary implementation includes a central processing unit (CPU) 3100, the RAM 3200, a user interface 3300, and a nonvolatile memory 3400. These elements are electrically connected to one another via a bus 3500. The nonvolatile memory 3400 may be a large-capacity storage device such as a solid-state drive (SSD) or a hard disc drive (HDD).

A delay-locked loop circuit and a semiconductor memory device including the same according to an exemplary implementation of the inventive concept may control a delay-locked loop operation on the basis of a delay-locked mode according to a received command, thereby decreasing the consumption of power required to perform the delay-locked loop operation and decreasing a locking time.

The shapes of elements illustrated in the appended drawings to clarify the inventive concept should be understood as examples. Thus, the elements may be embodied in many different forms. The same reference numerals denote the same elements throughout the drawings.

It would be apparent to those of ordinary skilled in the art that the inventive concept is not limited to the above exemplary implementations and the appended drawings and various changes in form and details may be made therein without departing from the spirit and scope of the following claims.

What is claimed is:

1. A delay-locked loop circuit for providing a delay-locked clock signal to a data output buffer, the delay-locked loop circuit comprising:
a first delay-locked-mode-based selector configured to select, as a first selected clock signal, one of a first divided clock signal, which is obtained by dividing a reference clock signal by N where N is an integer greater than or equal to 2, and the reference clock signal; and
a delay-locked mode controller configured to determine a delay-locked mode on the basis of a received external command, and control the first delay-locked-mode-based selector according to the delay-locked mode,
wherein the delay-locked clock signal is generated by comparing a phase of a feedback clock signal generated from the first selected clock signal with a phase of the reference clock signal,
wherein the delay-locked mode controller controls the first delay-locked-mode-based selector to select the first divided clock signal as the first selected clock signal when the delay-locked mode is determined to be a first delay-locked mode, and controls the first delay-locked-mode-based selector to select the reference clock signal as the first selected clock signal when the delay-locked mode is determined to be a second delay-locked mode.

2. The delay-locked loop circuit of claim 1, wherein the first delay-locked-mode-based selector comprises:
a first divider configured to divide the reference clock signal by N; and
a first signal selector configured to select one of the first divided clock signal and the reference clock signal.

3. The delay-locked loop circuit of claim 2, wherein the delay-locked mode controller activates the first divider and controls the first signal selector to select the first divided clock signal in the first delay-locked mode, and deactivates the first divider and controls the first signal selector to select the reference clock signal in the second delay-locked mode.

4. The delay-locked loop circuit of claim 1, further comprising:
a second delay-locked-mode-based selector; and
a delay line through which the first selected clock signal passes,
wherein the second delay-locked-mode-based selector selects one of a first delayed clock signal and a second divided clock signal as a second selected clock signal, wherein the first delayed clock signal is obtained by delaying the first selected clock signal by the delay line and the second divided clock signal is obtained by dividing the first delayed clock signal by M where M is an integer greater than or equal to 2.

5. The delay-locked loop circuit of claim 4, wherein the delay-locked mode controller controls the second delay-locked-mode-based selector to select the first delayed clock signal as the second selected clock signal when the delay-locked mode is determined to be the first delay-locked mode, and controls the second delay-locked-mode-based selector to select the second divided clock signal as the second selected clock signal when the delay-locked mode is determined to be the second delay-locked mode.

6. The delay-locked loop circuit of claim 5, wherein the delay-locked mode controller further comprises a locking time comparator configured to compare a locking time spent to generate the delay-locked clock signal with a reference time,
wherein the second delay-locked-mode-based selector is controlled on the basis of the delay-locked mode and a result of comparing the locking time with the reference time.

7. The delay-locked loop circuit of claim 4, further comprising a replica unit, and
wherein the feedback clock signal is a signal obtained when the second selected clock signal is delayed while passing through the replica unit.

8. The delay-locked loop circuit of claim 1, wherein the delay-locked mode controller determines the delay-locked mode to be the first delay-locked mode when the command is not a command instructing the data output buffer to perform a data output operation.

9. The delay-locked loop circuit of claim 1, wherein, when the command is a command instructing the data output buffer to perform a data output operation, the delay-locked mode is determined to be the second delay-locked mode.

* * * * *